(12) United States Patent
Kaskoun et al.

(10) Patent No.: US 9,478,528 B2
(45) Date of Patent: Oct. 25, 2016

(54) DEVICES, SYSTEMS AND METHODS USING THROUGH SILICON OPTICAL INTERCONNECTS

(71) Applicant: Qualcomm Incorporated, San Diego, CA (US)

(72) Inventors: Kenneth Kaskoun, San Diego, CA (US); Shiqun Gu, San Diego, CA (US); Matthew M. Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 375 days.

(21) Appl. No.: 13/771,638

(22) Filed: Feb. 20, 2013

(65) Prior Publication Data

US 2014/0131549 A1 May 15, 2014

Related U.S. Application Data

(60) Provisional application No. 61/726,249, filed on Nov. 14, 2012.

(51) Int. Cl.
*H01L 25/16* (2006.01)
*H01L 25/00* (2006.01)
*H04B 10/80* (2013.01)
*H01L 23/00* (2006.01)

(52) U.S. Cl.
CPC ............ *H01L 25/167* (2013.01); *H01L 25/50* (2013.01); *H04B 10/803* (2013.01); *H01L 24/73* (2013.01); *H01L 2224/0401* (2013.01); *H01L 2224/06181* (2013.01); *H01L 2224/16145* (2013.01); *H01L 2224/16225* (2013.01); *H01L 2224/32145* (2013.01); *H01L 2224/48091* (2013.01); *H01L 2224/48227* (2013.01); *H01L 2224/73253* (2013.01); *H01L 2224/73257* (2013.01); *H01L 2224/73265* (2013.01)

(58) Field of Classification Search
CPC combination set(s) only.
See application file for complete search history.

(56) References Cited

U.S. PATENT DOCUMENTS

| 5,244,818 | A | 9/1993 | Jokerst et al. |
| 5,637,907 | A * | 6/1997 | Leedy .......................... 257/434 |
| 7,626,207 | B2 * | 12/2009 | Vogel .................. H01L 27/3227 257/80 |
| 7,663,200 | B2 | 2/2010 | Shirakawa et al. |
| 7,923,273 | B2 | 4/2011 | Dutta |
| 8,148,202 | B2 | 4/2012 | Krishnamoorthy et al. |

(Continued)

OTHER PUBLICATIONS

International Search Report and Written Opinion - PCT/US2013/070011—ISA/EPO—Mar. 4, 2014.

*Primary Examiner* — Francis M Legasse, Jr.
(74) *Attorney, Agent, or Firm* — Michelle S. Gallardo

(57) ABSTRACT

Some implementations provide a semiconductor device that includes a first die and an optical receiver. The first die includes a back side layer having a thickness that is sufficiently thin to allow an optical signal to traverse through the back side layer. The optical receiver is configured to receive several optical signals through the back side layer of the first die. In some implementations, each optical signal originates from a corresponding optical emitter coupled to a second die. In some implementations, the back side layer is a die substrate. In some implementations, the optical signal traverses a substrate portion of the back side layer. The first die further includes an active layer. The optical receiver is part of the active layer. In some implementations, the semiconductor device includes a second die that includes an optical emitter. The second die coupled to the back side of the first die.

65 Claims, 18 Drawing Sheets

(56) References Cited

U.S. PATENT DOCUMENTS

| | | |
|---|---|---|
| 8,189,361 B2 | 5/2012 | Zhou et al. |
| 2004/0036074 A1 | 2/2004 | Kondo |
| 2005/0023550 A1 | 2/2005 | Eliashevich et al. |
| 2006/0280504 A1* | 12/2006 | Wang ................ G02B 1/00 398/138 |
| 2010/0135619 A1* | 6/2010 | Choi et al. ................ 385/88 |
| 2010/0148316 A1* | 6/2010 | Kim ................ H01L 24/29 257/621 |
| 2011/0058010 A1* | 3/2011 | Aviel ................ B41C 1/05 347/239 |
| 2011/0115002 A1 | 5/2011 | Tai et al. |
| 2012/0051685 A1 | 3/2012 | Su et al. |

* cited by examiner

DEVICES, SYSTEMS AND METHODS USING THROUGH SILICON OPTICAL INTERCONNECTS

The present application claims priority to U.S. Provisional Application No. 61/726,249 entitled "Through Silicon Optical Interconnects", filed Nov. 14, 2012, which is hereby expressly incorporated by reference herein.

FIELD

Various features relate to through silicon optical interconnects.

BACKGROUND

Wire bonding and through silicon vias (TSVs) are examples of technology that may be used to electrically connect two or more dice together. FIG. 1 illustrates two dice that are connected to each other by using TSVs. Specifically, FIG. 1 illustrates a first die 100, a second die 102 die, and several solder bumps 104a-b and 105a-b.

The first die 100 includes a first region 106 and a second region 108. The first region 106 may be referred to as the back side of the first die 100. The first region 106 may be a silicon material. The second region 108 may be referred to as the front side of the die 100. The second region 108 is an active region of the first die 100. The second region/active region 108 may include active and passive devices (e.g., transistors), conductive layers (e.g., metal layers) and dielectric layers. The active region 108 includes contact pads 110a-b.

The second die 102 includes a first region 112 and a second region 114. The first region 112 may be referred to as the back side of the first die 102. The first region 112 may be a silicon material. The first region 112 includes several contact pads 116a-b and several TSVs 118a-b. The second region 114 may be referred to as the front side of the second die 102. The second region 114 is an active region of the second die 102. The second region/active region 114 may include active and passive devices, conductive layers (e.g., metal layers), dielectric layers.

As shown in FIG. 1, the first die 100 and the second die 102 are coupled together through the solder bumps 104a-b. Specifically, the active region 108 of the first die 100 is electrically coupled to the active region 114 of the second die 102 through the contact pads 110a-b, the solder bumps 104a-b, the contact pads 116a-b, and the TSVs 118a-b. These connections provide the power signals to the first die 100 in some implementations.

FIG. 1 also illustrates the first die 100 and the second die 102 coupled together through the solder bumps 105a-b. Specifically, the active region 108 of the first die 100 is electrically coupled to the active region 114 of the second die 102 through the contact pads 111a-b, the solder bumps 104a-b, the contact pads 117a-b, and the TSVs 119a-b. In some implementations, these connections provide the other types of signals (e.g., control and/or data signals).

In addition or in lieu of solder bumps, some implementations may also use wire bonding (e.g., wire bonds 120a-b) to connect to the first die 100. The wire bonds 120a-b are shown as dashed to indicate that they are optional. The wire bonds 120a-b may be coupled to a printed circuit board (PCB), which is not shown. Similarly, the second die 102 may optionally include contact pads 121a-b, which are coupled to solder bumps 122a-b. The contact pads 121a-b may be coupled to the TSVs 118a-b. The solder bumps 122a-b may be coupled to a PCB (not shown).

The above electrical connections between the first and second dice 100-102 may be a suitable solution for connecting two dice in most instances. However, in some instances, an electrical connection may not be an optimal solution for connecting two or more dice together.

Therefore, there is a need for an improved design for coupling two or more dice together in a package. Ideally, such a design will utilize novel optical interconnect technology.

SUMMARY

Various features relate to through silicon optical interconnects.

A first example provides a semiconductor device that includes a first die and an optical receiver. The first die includes a back side layer having a thickness that is sufficiently thin to allow an optical signal to traverse through the back side layer. The optical receiver is configured to receive several optical signals through the back side layer of the first die.

According to an aspect, each optical signal originates from a corresponding optical emitter coupled to a second die. In some implementations, the back side layer is a die substrate. In some implementations, the optical signal traverses a substrate portion of the back side layer. In some implementations, the first die further includes an active layer, and where the optical receiver is part of the active layer.

According to one aspect, the first die further includes an active layer, and the optical receiver is further configured to receive a particular optical signal of the several optical signals through at least a portion of the active layer of the first die. In some implementations, the optical receiver is separate from the first die.

According to one aspect, the optical receiver comprises a plurality of optical sensors. In some implementations, the optical receiver is configured to associate a particular optical signal with a particular optical sensor. In some implementations, a particular optical sensor is configured to identify optical signals received at its optical sensors as originating from a particular emitter.

According to an aspect, the semiconductor device includes a second die that includes an optical emitter, where the second die coupled to the back side of the first die.

According to one aspect, the semiconductor device further includes a second die that includes an optical emitter, and a third die located between the first die and the second die, where the optical receiver is configured to receive the particular optical signal through the third die.

According to an aspect, the semiconductor device further includes a reflective component configured to reflect at least one optical signal to the optical receiver.

According to one aspect, the semiconductor device further includes a reflective component configured to scatter at least one optical signal.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a semiconductor device includes a first die and an optical transmitter. The first die includes a back side layer having a thickness that is sufficiently thin to allow an optical signal to traverse through the back side layer. The optical emitter is configured to transmit several optical signals through the back side layer of the first die.

According to an aspect, each optical signal is destined to a corresponding optical emitter coupled to a second die. In some implementations, the back side layer is a die substrate. In some implementations, the optical signal traverses a substrate portion of the back side layer.

According to one aspect, the first die further includes an active layer. The optical emitter is part of the active layer.

According to an aspect, the first die further includes an active layer. The optical emitter is further configured to transmit a particular optical signal of the several optical signals through at least a portion of the active layer of the first die.

According to one aspect, the optical emitter is separate from the first die. In some implementations, the optical emitter includes several optical transmitters.

According to an aspect, the semiconductor device further includes a second die that includes an optical receiver. The second die is coupled to the back side of the first die.

According to one aspect, the semiconductor device further includes a second die that includes an optical receiver, and a third die located between the first die and the second die. The optical emitter is configured to transmit the particular optical signal through the third die.

According to an aspect, the semiconductor device further includes a reflective component configured to reflect at least one optical signal from the optical emitter.

According to one aspect, the semiconductor device further includes a reflective component configured to scatter at least one optical signal.

According to an aspect, the optical transmitter is an optical device that is further configured to receive several optical signals.

According to an aspect, the semiconductor device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides, an apparatus that includes a first die comprising a back side layer having a thickness that is sufficiently thin to allow an optical signal to traverse through the back side layer. The apparatus further includes a means for receiving several optical signals through the back side layer of the first die.

According to an aspect, the first die further includes an active layer. The means for receiving is further configured to receive a particular optical signal of the several optical signals through at least a portion of the active layer of the first die. In some implementations, the means for receiving comprises several optical sensors. In some implementations, the means for receiving is configured to associate a particular optical signal with a particular optical sensor. In some implementations, a particular optical sensor is configured to identify optical signals received at its optical sensors as originating from a particular means for transmitting the optical signals.

According to one aspect, the apparatus further includes a means for reflecting at least one optical signal to the means for receiving.

According to an aspect, the apparatus further includes a means for scattering at least one optical signal.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides an apparatus that includes a first die comprising a back side layer having a thickness that is sufficiently thin to allow an optical signal to traverse through the back side layer. The apparatus also includes a means for transmitting several optical signals through the back side layer of the first die.

According to an aspect, the first die further includes an active layer. The means for transmitting is further configured to transmit a particular optical signal of the several optical signals through at least a portion of the active layer of the first die.

According to one aspect, the apparatus further includes a means for reflecting at least one optical signal from the means for transmitting.

According to an aspect, the apparatus further includes a means for scattering at least one optical signal.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fifth example provides a method for providing a semiconductor device. The method provides a first die that includes a back side layer having a thickness that is sufficiently thin to allow an optical signal to traverse through the back side layer. The method provides an optical receiver configured to receive several optical signals through the back side layer of the first die.

According to an aspect, the first die further includes an active layer. The optical receiver is further configured to receive a particular optical signal of the several optical signals through at least a portion of the active layer of the first die.

According to one aspect, the method further provides a second die that includes an optical emitter. The method also couples the second die to the first die.

According to an aspect, the method further provides a reflective component configured to reflect at least one optical signal to the optical receiver.

According to one aspect, the method further includes providing a reflective component configured to scatter at least one optical signal.

A sixth example provides a method for providing a semiconductor device. The method includes providing a first die comprising a back side layer having a thickness that is sufficiently thin to allow an optical signal to traverse through the back side layer. The method also provides an optical emitter configured to transmit several optical signals through the back side layer of the first die.

According to an aspect, the first die further includes an active layer. The optical emitter is further configured to transmit a particular optical signal of the several optical signals through at least a portion of the active layer of the first die.

According to one aspect, the method further includes providing a second die that includes an optical receiver. The method also couples the second die to the first die.

According to an aspect, the method further includes providing a reflective component configured to reflect at least one optical signal from the optical emitter.

According to one aspect, the method further includes providing a reflective component configured to scatter at least one optical signal.

A seventh example provides a method for calibrating at least one optical interconnect between a first die and a second die. The method transmits an optical signal from an emitter on the first die. The method associates a receiver on the second die to the emitter on the first die based on which receiver receives the transmitted optical signal from the emitter.

According to an aspect, the associating of the receiver on the second die to the emitter on the first die establishes an optical interconnect between the first die and the second die. In some implementations, the first die includes several emitters and the second die includes several receivers. In some implementations, the method further includes iteratively performing the transmitting and the associating for more than one emitter from the several emitters.

According to one aspect, the associating of the receiver to the emitter is performed after the first die is coupled to the second die.

An eighth example provides a machine-readable storage medium that includes instructions for calibrating at least one optical interconnect between a first die and a second die, which when executed by a processor causes the processor to: transmit an optical signal from an emitter on the first die, and associate a receiver on the second die to the emitter on the first die based on which receiver receives the transmitted optical signal from the emitter.

According to an aspect, the associating of the receiver on the second die to the emitter on the first die establishes an optical interconnect between the first die and the second die. In some implementations, the first die includes several emitters and the second die includes several receivers. In some implementations, the machine-readable storage medium further includes instructions, which when executed by a processor causes the processor to iteratively perform the transmitting and the associating for more than one emitter from the several emitters.

According to one aspect, the instructions, which when executed by a processor causes the processor to associate the receiver to the emitter is performed after the first die is coupled to the second die.

DRAWINGS

Various features, nature and advantages may become apparent from the detailed description set forth below when taken in conjunction with the drawings in which like reference characters identify correspondingly throughout.

DETAILED DESCRIPTION

Figure 1:
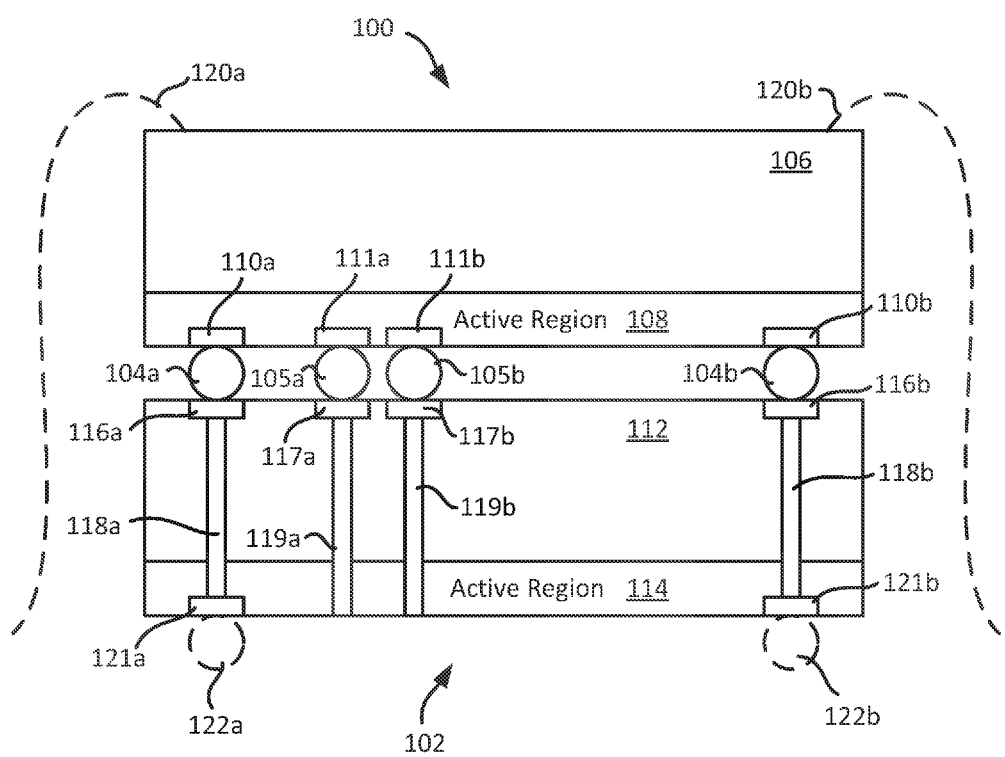
FIG. 1 illustrates two dice coupled together using through silicon vias (TSVs).

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some exemplary implementations of this disclosure pertain to a semiconductor device that includes a die and an optical receiver. The die includes a back side layer having a thickness that is sufficiently thin to allow an optical signal to traverse through the back side layer. The optical receiver for receiving several optical signals through the back side layer of the die. Each particular optical signal from several optical signals transmitted from a particular optical emitter from several optical emitters.

Some exemplary implementations of this disclosure also pertain to a semiconductor device that includes a die and several optical emitters. The die includes a back side layer having a thickness that is sufficiently thin to allow an optical signal to traverse through the back side layer. Each particular optical emitter is for transmitting a particular optical signal through the back side layer of the die to an optical receiver.

Some exemplary implementations of this disclosure also pertain to a semiconductor device that includes a die, reflective component, and an optical receiver. The die includes a back side layer having a thickness that is sufficiently thin to allow an optical signal to traverse through the back side layer. In some implementations, the optical light wavelength will be selected so that the absorption rate and/or loss through the back side layer is low. For example, in some implementations, the optical light wavelength will be greater than 1.1 microns (μm) when the back side layer (e.g., substrate) of the die is silicon (Si). The reflective component is for reflecting the optical signal from an optical emitter. The optical receiver is for receiving the optical signal through the back side layer of the die. The received optical signal reflected from the reflective component.

Some exemplary implementations of this disclosure also pertain to a semiconductor device that includes a die, an optical emitter, and a reflective component. The die includes a back side layer having a thickness that is sufficiently thin to allow an optical signal to traverse through the back side layer. The optical emitter is for transmitting a particular optical signal through the back side layer of the die. In some implementations, the optical signal can be modulated to code the information before transmission. The reflective component is for reflecting the particular optical signal from the optical emitter.

Exemplary Through Silicon Optical Interconnects

Electrical connections may be sufficiently good or adequate in some cases to connect two dice together. However, in other instances, electrical connections between two dice may not provide the best possible or optimal solution. For example, in instances of relatively high signal frequency, an optical connection or optical interconnect provides better power efficiency than an electrical connection. In some implementations, the better power efficiency of the optical interconnect is due to its low parasitic load when the optical signal travels through long distances (e.g., several millimeters (mm)).

Figure 2:
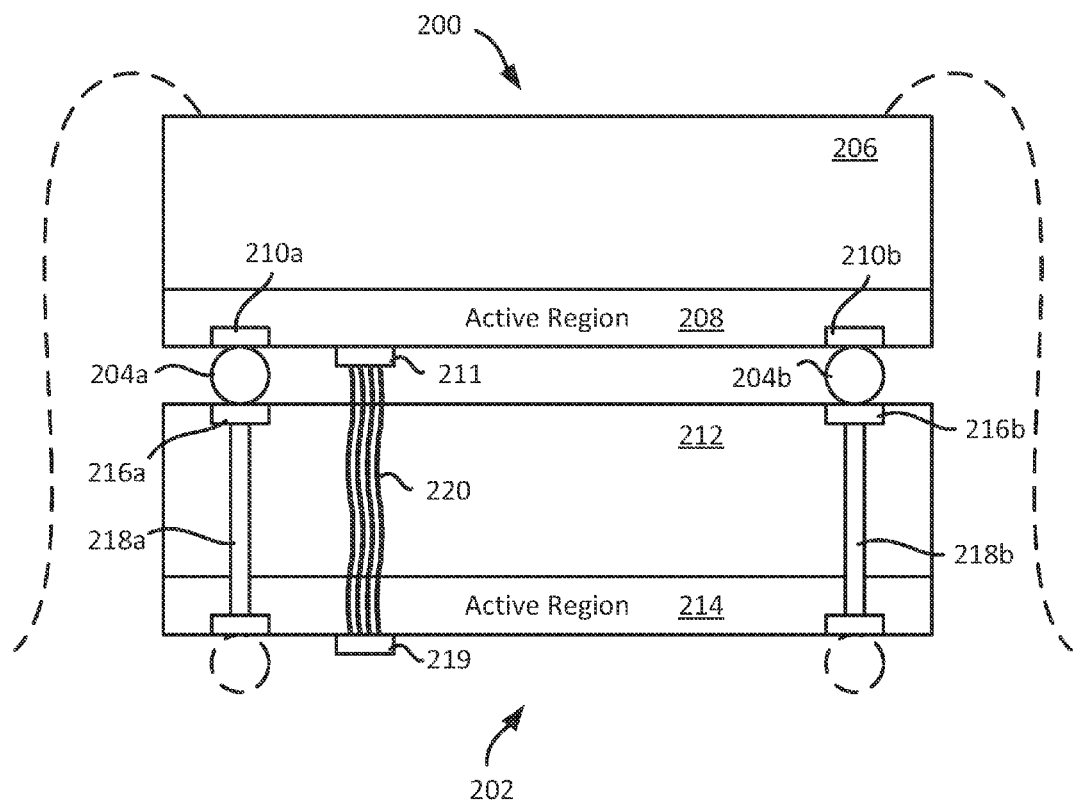
FIG. 2 illustrates two dice coupled together using a though silicon optical interconnect.

FIG. 2 illustrates two dice that are coupled together using at least one through silicon optical interconnect. Specifically, FIG. 2 illustrates a first die 200, a second die 202, and several solder bumps 204a-b. The first die 200 and the second die 202 are each a silicon die in some implementations. The first die 200 includes a first region 206 and a second region 208. The first region 206 may be referred to as the back side of the first die 200 (it may also be referred to as the die substrate). The first region 206 may be a silicon material. In some implementations, the first region 206 may be glass or plastic. The second region 208 may be referred to as the front side of the die 200. The second region 208 is an active region of the first die 200. The second region/active region 208 may include active and passive devices, conductive layers (e.g., metal layers), and dielectric layers. The active region 208 includes contact pads 210a-b.

As further shown in FIG. 2, an optical emitter/modulator 211 is coupled to the active region 208. The optical emitter 211 is a modulating optical light source in some implementations. For purposes of simplicity, the optical emitter 211 will be described as one component. However, it should be understood that the optical emitter 211 may be several components, including an emitter component and a modulator component. In some implementations, the emitter component is a component that generates a light source (e.g., IIIV laser), while the modulator component may be a component that modulates the phase and/or intensity of the light generated by the emitter. In some implementations, the modulations of the phase and/or intensity of the light from the emitter component are based on electrical signals from first die 200.

In FIG. 2, the optical emitter 211 is separate from the first die 200 (i.e., the optical emitter 211 is outside of the active region 208). However, in some implementations, the optical emitter 211 is located within the first die 200 (e.g., part of the active region 208 of the first die 200). Although only one optical emitter is shown in FIG. 2, in some implementations, multiple emitters may be coupled to the first die 200. The optical emitter 211 a light source/signal that can be detected and/or received by an optical receiver. Such an optical receiver will be further described below with reference to the second die 202.

As shown in FIG. 2, the second die 202 includes a first region 212 and a second region 214. The first region 212 may be referred to as the back side of the first die 202 (the back side of the die may also be referred to as the die substrate). The first region 212 may be a silicon material and may include dielectrics layers. However, in some implementations, the first region 212 may be glass or plastic. The first region 212 includes several contact pads 216a-b and several TSVs 218a-b. The second region 214 may be referred to as the front side of the second die 202. The second region 214 is an active region of the second die 202. The second region/active region 214 may include active and passive devices, conductive layers (e.g., metal layers), and dielectric layers.

FIG. 2 also illustrates an optical receiver 219 that is coupled to the active region 214 of the second die 202. The optical receiver 219 may include an optical sensor that is capable of receiving and/or detecting an optical signal from an optical emitter (such as optical signal 220 from optical emitter 211). The optical receiver 219 is separate from the second die 202 in some implementations. In other implementations, the optical receiver 219 is located within the second die 202 (e.g., part of the active region 214 of the second die 202). Although only one optical receiver is shown in FIG. 2, in some implementations, multiple optical receivers may be coupled to the second die 202.

FIG. 2 illustrates an example of a communication between two dice. Specifically, FIG. 2 illustrates how the first die 200 may communicate with the second die 202. In some implementations, an electrical signal from the first die 200 (the electrical signal may be generated (e.g., internally generated) by the first die 200 or may be an electrical signal received by the first die 200 by another input, which is not shown) is converted to an optical signal. The optical signal is then transmitted to the second die 202, where the optical signal is converted back to an electrical signal. The conversion of an electrical signal to an optical signal or vice versa (e.g., conversion of an optical signal to an electrical signal) may be performed by conventional methods known to those of ordinary skill in the art. Any circuit, circuitry and/or components necessary for such conversions are not shown for the purpose of clarity. However, one of ordinary skill in the art will appreciate and understand that such a circuit, circuitry and/or components is well known to one of ordinary skill in the art. The optical signal path (e.g., optical signal path 220) from the optical emitter 211 to the optical receiver 219 is herein referred to as the optical interconnect. However, in order for the optical interconnect to work (i.e., in order for the optical receiver 219 to be able to receive the optical signal 220 through the first region 212 of the second die 202), the first region 212 must be sufficiently thin to behave like a transparent material and thereby allow light to pass through (e.g., the first region 212 must have low absorption rate and/or loss). The absorption rate and/or loss of a material refers to the material's ability/property of absorbing light. In some implementations, the first region 212 of the second die 202 must be less than 100 microns (μm). The wavelength of the optical signal is greater than 1 microns (μm) in some implementations. For example the wavelength of the optical signal may be between 1.0 μm to 1.6 μm for a silicon (Si) substrate in some implementations. If the first region 212 is too thick (i.e., greater than a threshold thickness), then the first region 212 will absorb the optical signal that is transmitted by an optical emitter. In some implementations, the optical interconnect above bypasses the need for a waveguide.

The optical interconnect described above may replace some or all of the electrical interconnects described in FIG. 1. Specifically, the optical interconnect may replace the electrical interconnect defined by the contact pads 111a-b, the solder bumps 104a-b, the contact pads 117a-b, and the TSVs 119a-b of FIG. 1 in some implementations. In some implementations, the above optical interconnect may be used for high signal frequencies or any type of signals (e.g., control and/or data signals).

The optical interconnect provides several benefits and advantages over a pure electrical connection. As discussed above, optical interconnects are more power efficient than electrical connections when using high signal frequencies. In addition, using optical interconnects would eliminate the need for TSVs and thus reduce complications due to the manufacturing TSVs (e.g., interaction of TSV to active silicon (Si) transistors). Moreover, the use of optical interconnects allow for looser tolerances than TSVs, which translates into better assembly yields and a less expensive assembly process.

As shown in FIG. 2, the first die 200 and the second die 202 are also electrically coupled together through the solder bumps 204a-b. Specifically, the active region 208 of the first die 200 is electrically coupled to the active region 214 of the second die 202 through the contact pads 210a-b, the solder bumps 204a-b, the contact pads 216a-b, and the TSVs 218a-b. In some implementations, the electric connection (using the TSVs 218a-b) between the first die 200 and the second die 202 is used for power signals and/or low frequency signals.

Figure 3:
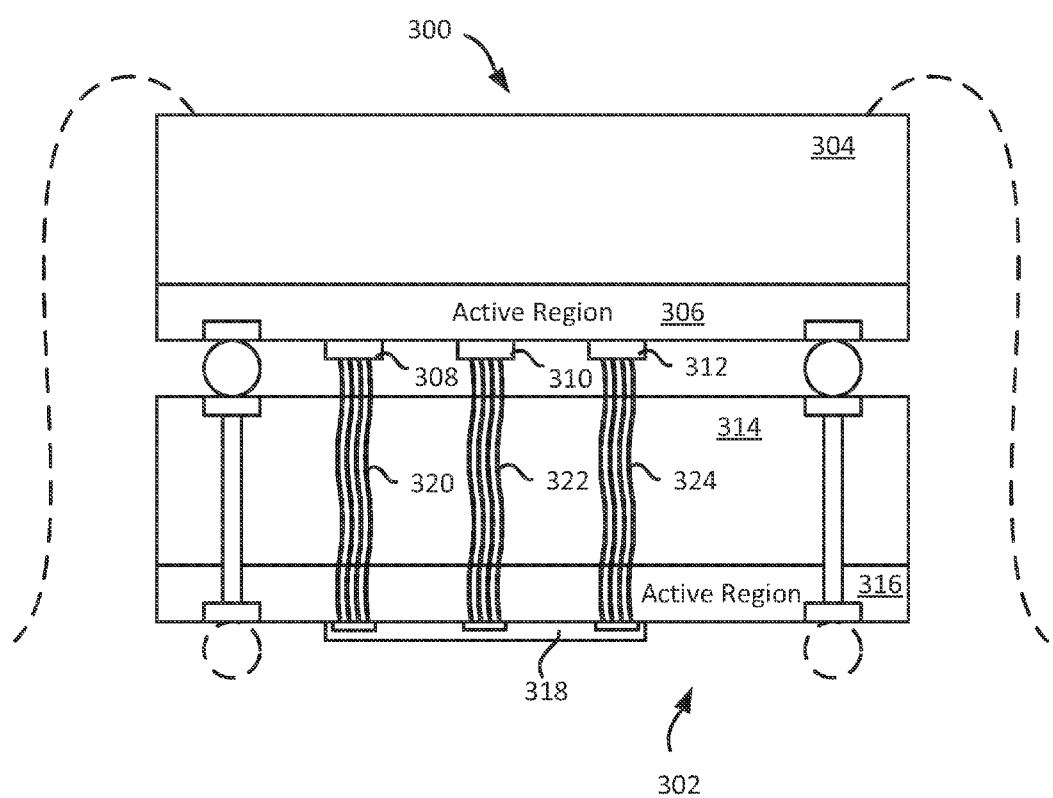
FIG. 3 illustrates two dice coupled together using through silicon optical interconnects.

FIG. 3 illustrates another implementation for using optical interconnects to couple two dice. FIG. 3 is similar to FIG. 2, except that a first die has multiple optical emitters and a second die has a large receiver capable of receiving and/or detecting optical signals from different sources (e.g., different emitters). Specifically, FIG. 3 illustrates a first die 300 that is coupled to a second die 302. The first die 300 includes a first region 304 and a second region 306. The first region 304 may be made of silicon. In some implementations, the first region 304 may be referred to as the back side of the first die 300 (the back side of the die may also be referred to as the die substrate). The second region 306 is an active region of the die 300. The second region 306 is coupled to a first optical emitter 308, a second optical emitter 310 and a third optical emitter 312. The first, second, and third optical emitters 308-312 may be part of the second region 306 (e.g., integrated in the second region 306) in some implementations.

The second die 302 includes a first region 314 and a second region 316. In some implementations, the first region 314 may be referred to as the back side of the second die 302 (the back side of the die may also be referred to as the die substrate). The second region 316 is coupled to a large optical receiver 318. The optical receiver 318 is large relative to the size of the optical emitters 308-312. The optical receiver 318 may be part of the second region 316 (e.g., integrated in the second region 316) of the second die 302 in some implementations. The optical receiver 318 is for receiving optical signals from the optical emitters 308-312. Specifically, the optical receiver 318 is for receiving a first signal 320 from the first emitter 308, a second signal 322 from the second emitter 322, and a third signal 324 from the third emitter 324. In some implementations, the first, second, and third signals 320-324 have the same properties (e.g., same wavelength). In other implementations, the first, second, and third signals 320-324 have different properties (e.g., different wavelength). In such instances, the optical receiver 318 may be able to distinguish the different wavelengths. The large optical receiver 318 may be an array of optical sensors. In some implementation, a particular optical sensor from the optical receiver 318 may be associated to a particular optical emitter. As such, the large optical receiver 318 may include several smaller optical receivers in some implementations.

There are several advantages to using a large optical receiver 318. For one, it allows for looser manufacturing tolerances when attaching an optical receiver to a die and/or coupling two dice together. In one example, an optical receiver may include an array of optical sensors. The relative positions of the optical sensors is known and mapped. These optical sensors may be calibrated and/or assigned to correspond to certain optical signals from optical emitters after being coupled to the die. Thus, it is not crucial for the optical receiver to be perfectly aligned during an assembly process. As a result, better manufacturing yields are achieved during the assembly process.

In addition to or in lieu of using a large optical receiver, some implementations may use a large optical emitter. A large optical emitter may include several smaller optical emitters. As such, a large optical emitter may be an array of smaller optical emitters. In some implementations, the use of a large optical emitter may provide the same advantages as described above for using a large optical receiver. Moreover, an array of optical emitters may be calibrated and assigned in a similar manner as described above for a large optical receiver. Having described the use of large optical emitters and large optical receivers, the calibration and assignment of these optical sensors and emitters will now be further described below.

FIGS. 4-11 illustrate various examples of how calibration and/or assignment of optical emitters and receivers may be used in some implementations of through silicon interconnects. For the purpose of simplification and clarity, not all the components of a die (IC) are shown in FIGS. 4-11.

Figure 4:
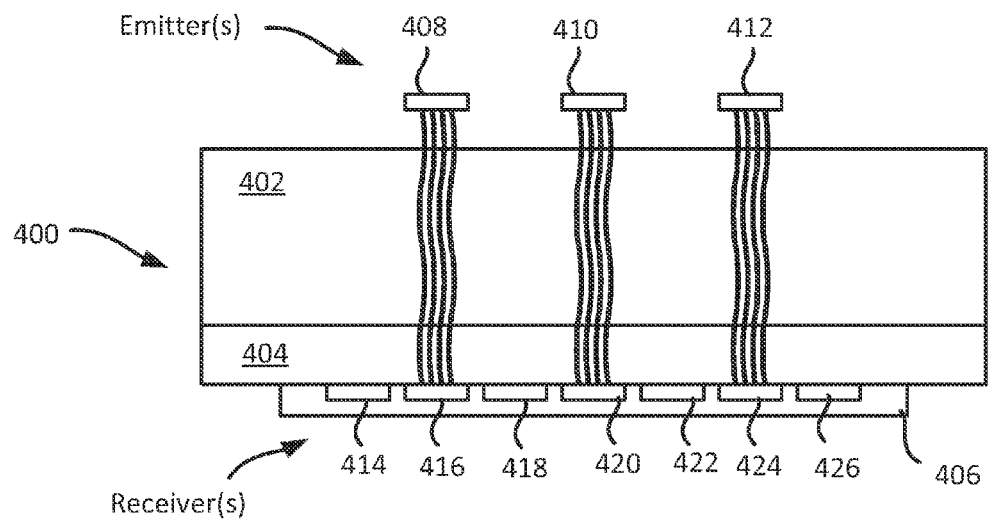
FIG. 4 illustrates a configuration of multiple optical emitters transmitting to a single optical receiver with several optical sensors.

FIG. 4 illustrates a configuration that includes a die, a large optical receiver and several optical emitters. As shown in FIG. 4, the die 400 includes a first region 402 and a second active region 404. In some implementations, the first region 402 may be referred to as the back side of the die 400 (the back side of the die may also be referred to as the die substrate). FIG. 4 also illustrates an optical receiver 406, a first optical emitter 408, a second optical emitter 410, and a third optical emitter 412.

The optical receiver 406 is coupled to the die 400. More specifically, the optical receiver 406 is coupled to the second active region 404. The optical receiver 406 may be integrated in the second active region 404 in some implementations. The optical receiver 406 may be part of the die 400 or a separate component of the die 400. As further shown in FIG. 4, the optical receiver 406 includes an array of optical receivers 414-426. These optical receivers 414-426 are optical sensors. As such, the optical receiver 406 includes an array of optical sensors.

The optical emitters 408-412 are optical emitters that are coupled to another die (which is not shown for the purpose of clarity). This die may be a die that is coupled to the die 400. As shown in FIG. 4, the optical emitters 408-412 are aligned in such a way that a first optical signal from the first optical emitter 408 is received through the second active region 404 by the optical receiver 416. Similarly, the second optical emitter 410 is aligned in such a way that a second optical signal from the second optical emitter 410 is received through the second active region 404 by the optical receiver 420. In addition, the third optical emitter 412 is aligned in such a way that a third optical signal from the third optical emitter 412 is received through the second active region 404 by the optical receiver 424.

In this configuration, any optical signal received by the optical receiver 416 will be assumed to have been transmitted by the first optical emitter 408. Similarly, any optical signal received by the optical receiver 420 will be assumed to have been transmitted by the second optical emitter 410. In addition, any optical signal received by the optical receiver 424 will be assumed to have been transmitted by the third optical emitter 412.

Figure 5:
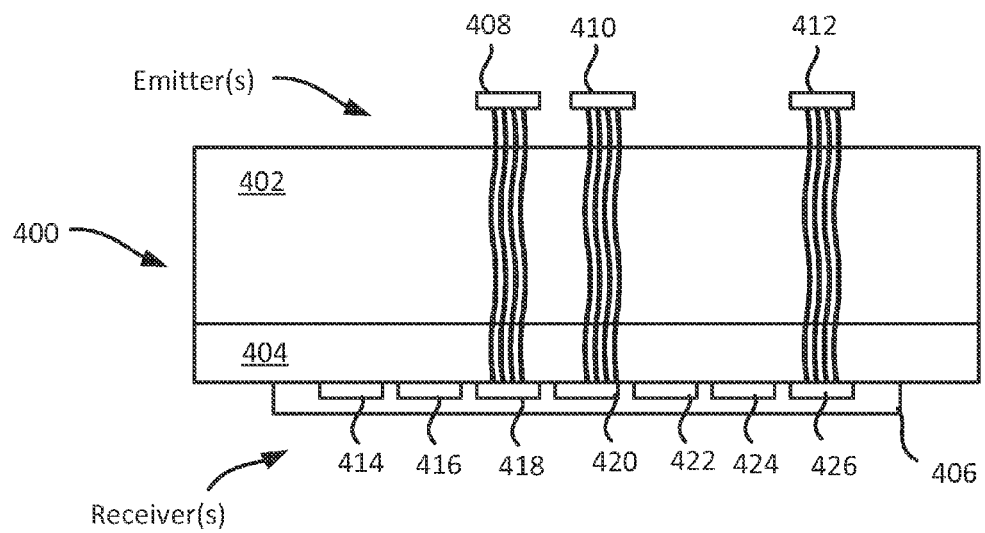
FIG. 5 illustrates another configuration of multiple optical emitters transmitting to a single optical receiver with several optical sensors.

In some instances, the alignment between emitters and receivers may be different. FIG. 5 illustrates an example of a configuration that includes a die, an optical receiver and several optical emitters. FIG. 5 is similar to FIG. 4, except that the alignment of the emitters 408-412 relative to the optical receivers 414-426 is different. As shown in FIG. 5, the first emitter 408 is now aligned with the optical receiver 418, the second emitter 410 is now aligned with the optical receiver 420, and the third optical emitter 412 is now aligned with the optical receiver 424.

The above example of alignment and configuration of optical emitters and optical receivers is not limited to several optical emitters and one large optical receiver. The novel alignment and configuration described above may also be used in a configuration that include a large optical emitter and a large optical receiver, as well as a configuration that includes a large optical emitter and several optical receivers. An example of the configuration that includes a large optical emitter and a large optical receiver is shown and described with reference to FIGS. 6-7, while an example of a configuration that includes a large optical emitter and several optical receivers is shown and described with reference to FIGS. 8-9.

Figure 6:
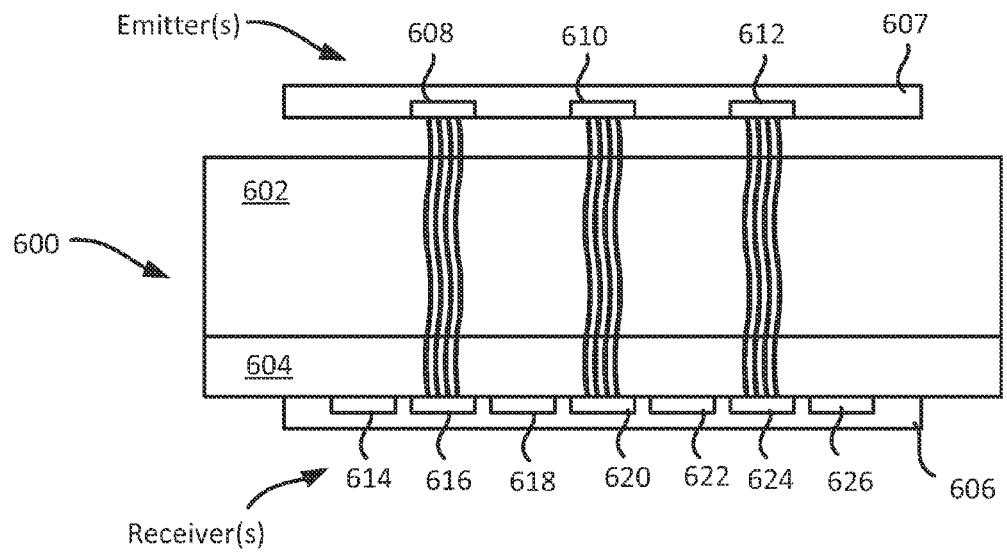
FIG. 6 illustrates a configuration of single optical emitter with several optical emitters transmitting to a single optical receiver with several optical sensors.

FIG. 6 illustrates a configuration that includes a die, a large optical receiver and a large optical emitter. As shown in FIG. 6, the die 600 includes a first region 602 and a second active region 604. In some implementations, the first region 602 may be referred to as the back side of the die 600 (the back side of the die may also be referred to as the die substrate). FIG. 6 also illustrates an optical receiver 606 and an optical receiver 607.

The optical receiver 606 is coupled to the die 600. More specifically, the optical receiver 606 is coupled to the second active region 604. The optical receiver 606 may be integrated in the second active region 604 in some implementations. The optical receiver 606 may be part of the die 600 or a separate component of the die 600. As further shown in FIG. 6, the optical receiver 606 includes an array of optical receivers 614-626. These receivers 614-626 are optical sensors. As such, the optical receiver 606 includes an array of optical sensors.

As shown in FIG. 6, the optical emitter 607 includes optical emitters 608-612. As such the optical emitter is an array of optical emitters in some implementations. The optical emitter 607 is an optical emitter that is coupled to another die (which is not shown for the purpose of clarity). This die may be a die that is coupled to the die 600. As shown in FIG. 6, the optical emitter 607 is aligned in such a way that a first optical signal from the optical emitter 608 is received through the second active region 604 by the optical receiver 616. Similarly, the optical emitter 607 is aligned in such a way that a second optical signal from the optical emitter 610 is received through the second active region 604 by the optical receiver 620. In addition, the optical emitter 607 is aligned in such a way that a third optical signal from the optical emitter 612 is received through the second active region 604 by the optical receiver 624.

As such, in this configuration, any optical signal received by the optical receiver 616 will be assumed to have been transmitted by the optical emitter 608. Similarly, any optical signal received by the optical receiver 620 will be assumed to have been transmitted by the optical emitter 610. In addition, any optical signal received by the optical receiver 624 will be assumed to have been transmitted by the optical emitter 612.

Figure 7:
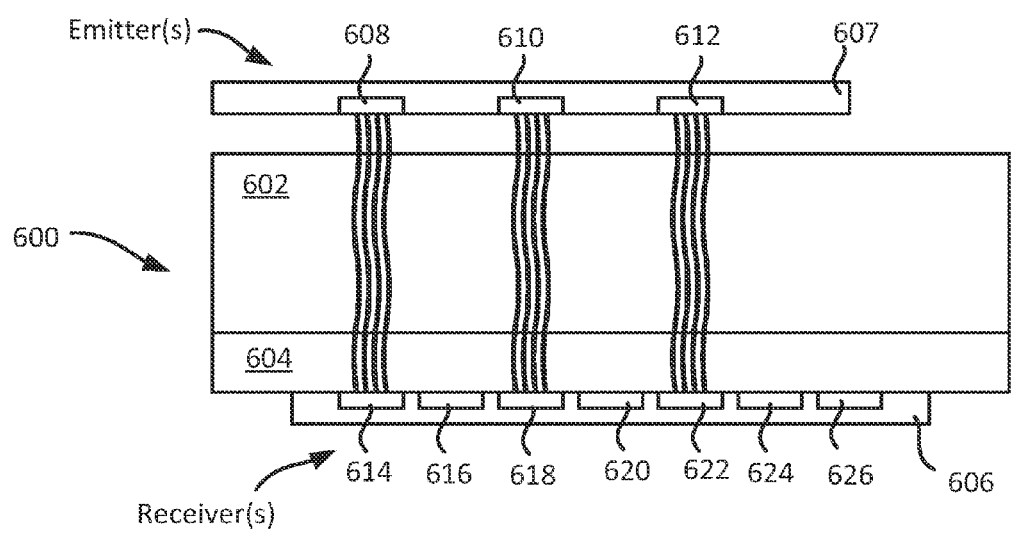
FIG. 7 illustrates another configuration of single optical emitter with several optical emitters transmitting to a single optical receiver with several optical sensors.

FIG. 7 illustrates an example of a configuration that includes a die, a large optical receiver and a large optical emitter. FIG. 7 is similar to FIG. 6, except that the alignment of the optical emitter 607 relative to the optical receiver 606 is different. As shown in FIG. 7, the emitter 608 is now aligned with the optical receiver 614, the emitter 610 is now aligned with the optical receiver 618, and the optical emitter 612 is now aligned with the optical receiver 422.

Figure 8:
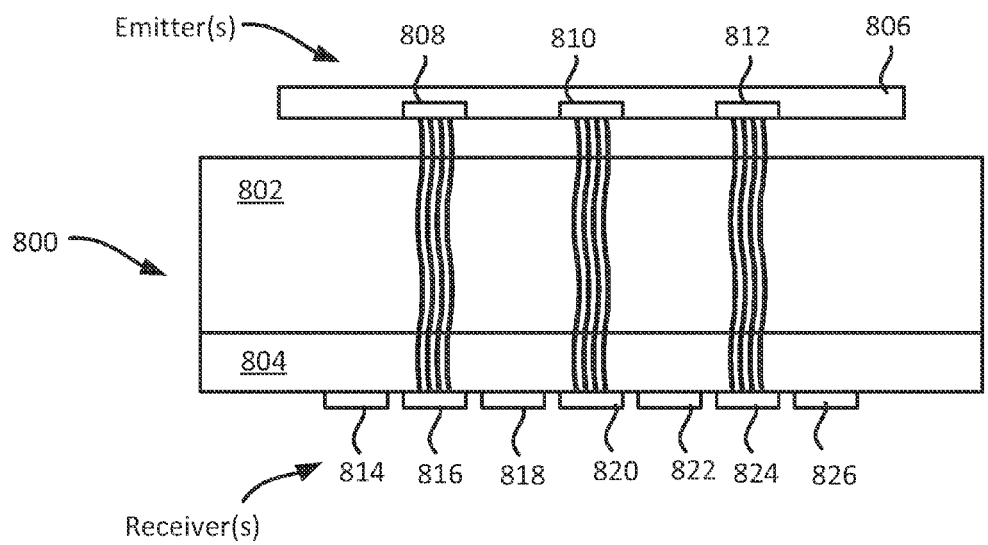
FIG. 8 illustrates a configuration of single optical emitter with several optical emitters transmitting to several optical receivers.

FIG. 8 illustrates a configuration that includes a die, a large optical emitter and several optical receivers. As shown in FIG. 8, the die 800 includes a first region 802 and a second active region 804. In some implementations, the first region 802 may be referred to as the back side of the die 800 (the back side of the die may also be referred to as the die substrate). FIG. 8 also illustrates an optical receiver 606 and several optical receivers 814-826.

The optical receivers 814-826 are coupled to the die 800. More specifically, the optical receivers 814-826 are coupled to the second active region 804. The optical receivers 814-826 may be integrated in the second active region 804 in some implementations. The optical receivers 814-826 may be part of the die 800 or separate components of the die 800.

As shown in FIG. 8, the optical emitter 806 includes optical emitters 608-812. As such the optical emitter is an array of optical emitters in some implementations. The optical emitter 807 is an optical emitter that is coupled to another die (which is not shown for the purpose of clarity). This die may be a die that is coupled to the die 800. As shown in FIG. 8, the optical emitter 806 is aligned in such a way that a first optical signal from the optical emitter 808 is received through the second active region 804 by the optical receiver 816. Similarly, the optical emitter 806 is aligned in such a way that a second optical signal from the optical emitter 810 is received through the second active region 804 by the optical receiver 820. In addition, the optical emitter 806 is aligned in such a way that a third optical signal from the optical emitter 812 is received through the second active region 804 by the optical receiver 824.

As such, in this configuration, any optical signal received by the optical receiver 816 will be assumed to have been transmitted by the optical emitter 808. Similarly, any optical signal received by the optical receiver 820 will be assumed to have been transmitted by the optical emitter 810. In addition, any optical signal received by the optical receiver 824 will be assumed to have been transmitted by the optical emitter 812.

Figure 9:
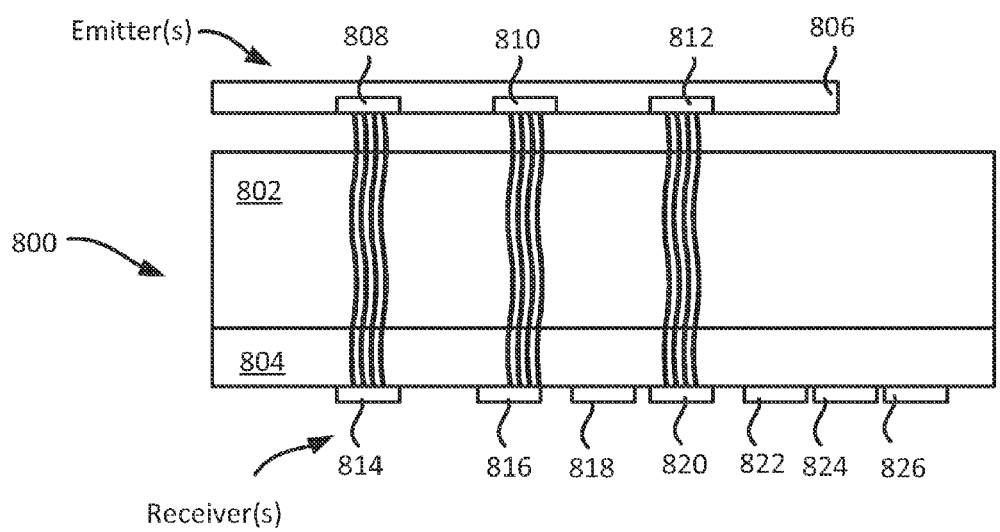
FIG. 9 illustrates another configuration of single optical emitter with several optical emitters transmitting to several optical receivers.

FIG. 9 illustrates an example of a configuration that includes a die, a large optical emitter and several optical receivers. FIG. 9 is similar to FIG. 8, except that the alignment of the optical receivers 814-826 relative to the optical emitter 806 is different. As shown in FIG. 9, the optical emitter 808 is now aligned with the optical receiver 814, the optical emitter 810 is now aligned with the optical receiver 816, and the optical emitter 812 is now aligned with the optical receiver 420.

Figure 10:
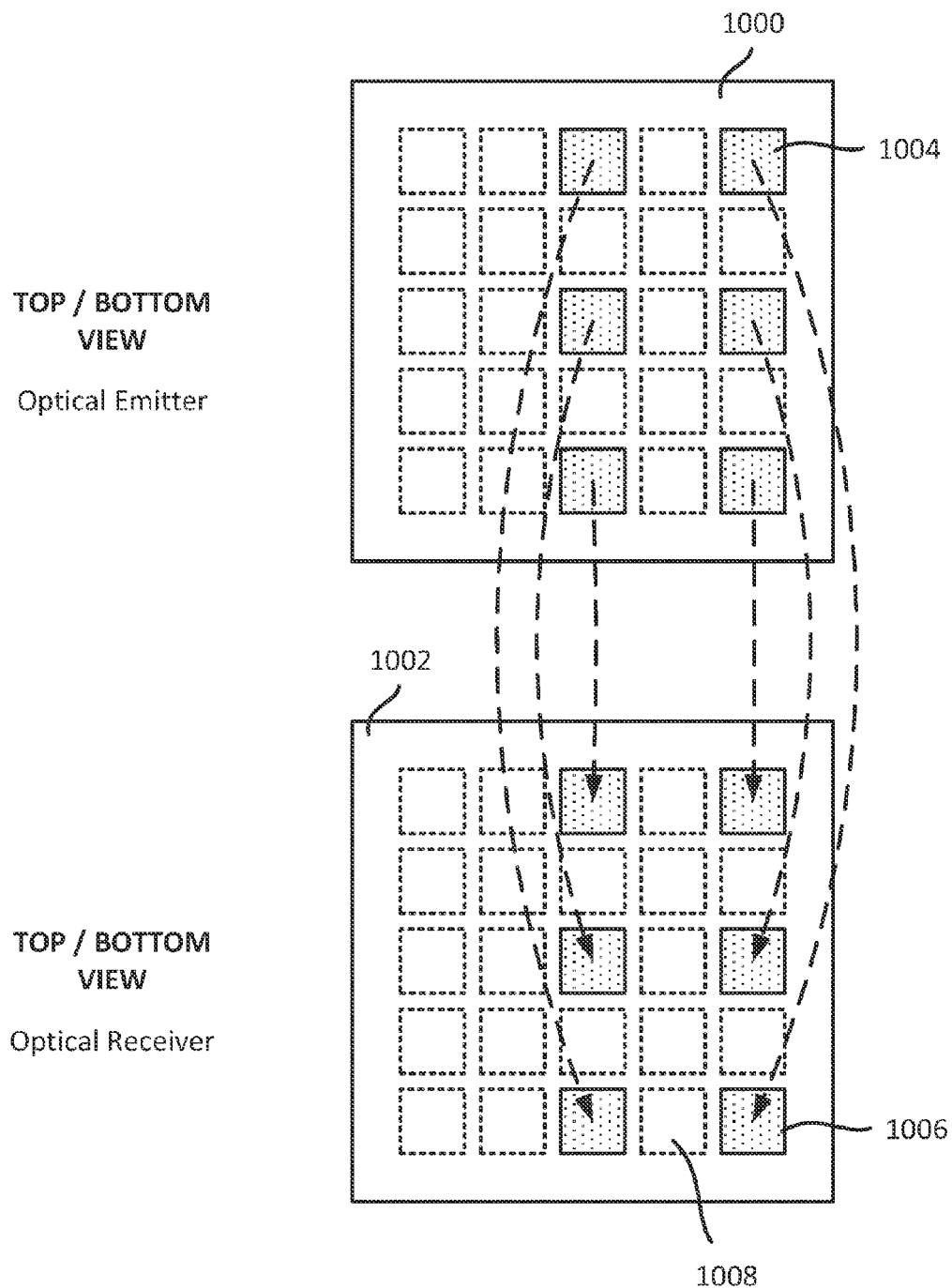
FIG. 10 illustrates a configuration of single optical emitter with several optical emitters transmitting to a single optical receiver with several optical sensors.
Figure 11:
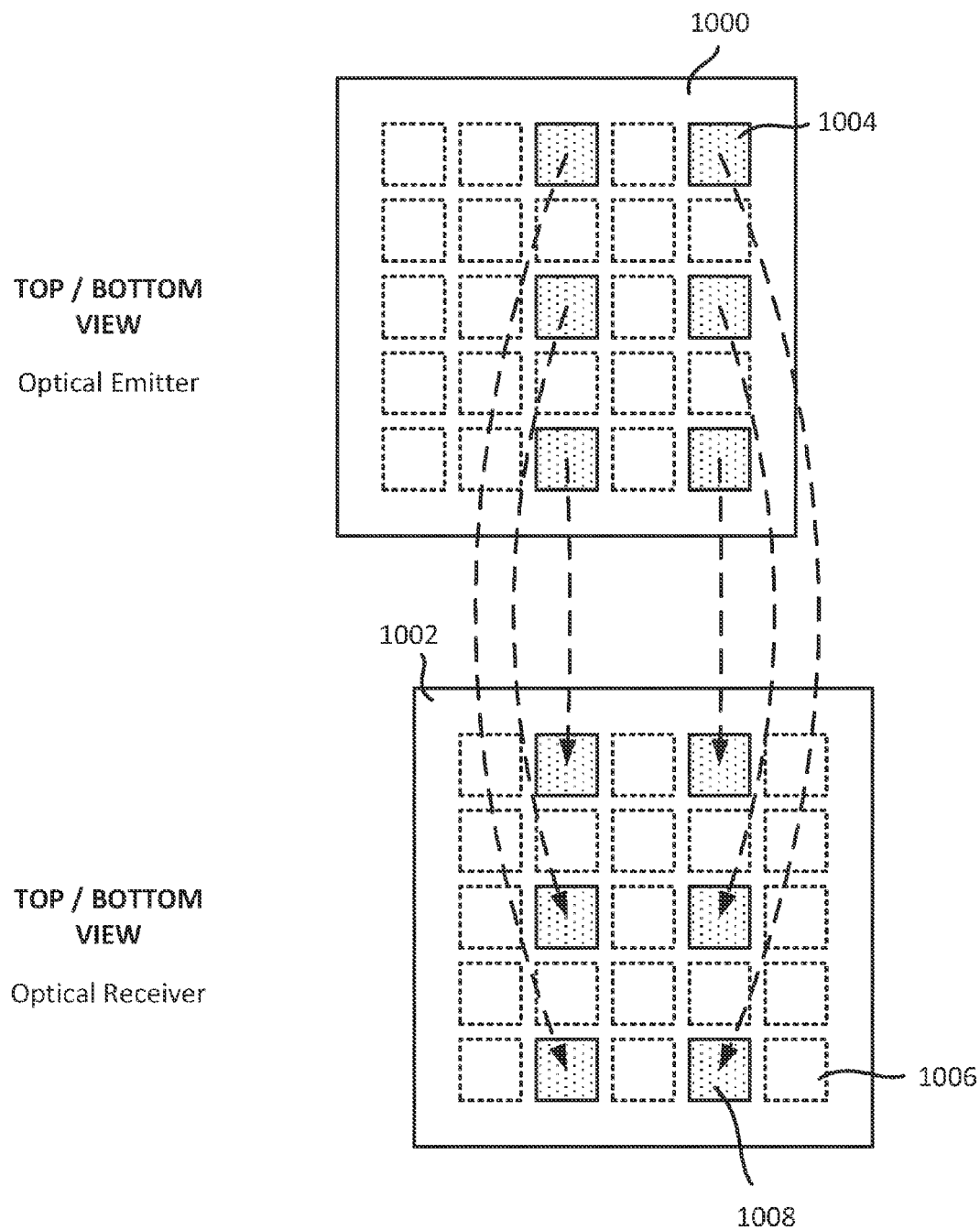
FIG. 11 illustrates another configuration of single optical emitter with several optical emitters transmitting to a single optical receiver with several optical sensors.

FIGS. 10-11 illustrate examples of the alignment and configuration of optical emitters and receivers in some implementations. FIG. 10 illustrates an optical emitter 1000 and an optical receiver 1002. The optical emitter 1100 includes an array of optical emitters. The optical receiver 1002 includes an array of optical receivers/sensors. As shown in FIG. 10, the optical emitter 1004 is aligned/associated with the optical receiver 1006.

FIG. 11 illustrates the optical emitter 1000 and the optical receiver 1002 of FIG. 10. FIG. 11 is similar to FIG. 10, except that optical emitter 1000 is offset from the optical receiver 1002. As shown in FIG. 11, when the optical emitter 1000 is offset from the optical receiver 1002, the alignment of some or all of the emitters and receivers changes. As shown in FIG. 11, the optical emitter 1004 is now aligned/associated with optical receiver 1008, instead of optical receiver 1006. Similarly, the other optical emitters are also aligned/associated with different optical receivers. FIGS. 10-11 illustrates how optical emitters and optical receivers may be configurable after the two dice are coupled to each other. Since these optical emitters and optical receivers are configurable, the placement of the optical emitters and/or optical receivers on their respective die does not have to be as accurate and/or precise if the optical devices, optical emitters and/or optical receivers were not configurable. Since, the alignment, calibration, and/or configuration is done after the dice are coupled (e.g., physically coupled) to each other, the alignment, calibration, and/or configuration of the optical emitters and/or optical receivers can take into account any misalignment of the dice. In some implementations, the ability to calibrate, adjust and/or configure the optical emitters and/or optical receivers will result in better manufacturing yields because dice that are not perfectly aligned may still be operational and/or functional. An example of a method for calibrating, configuring and/or adjusting optical emitters and/or optical receivers is further described below with reference to FIG. 17.

FIGS. 4-11 illustrate implementations where the optical signals traverse through a single active region of a die. However, in some implementations, the optical signals may traverse through multiple active regions of dice.

Figure 12:
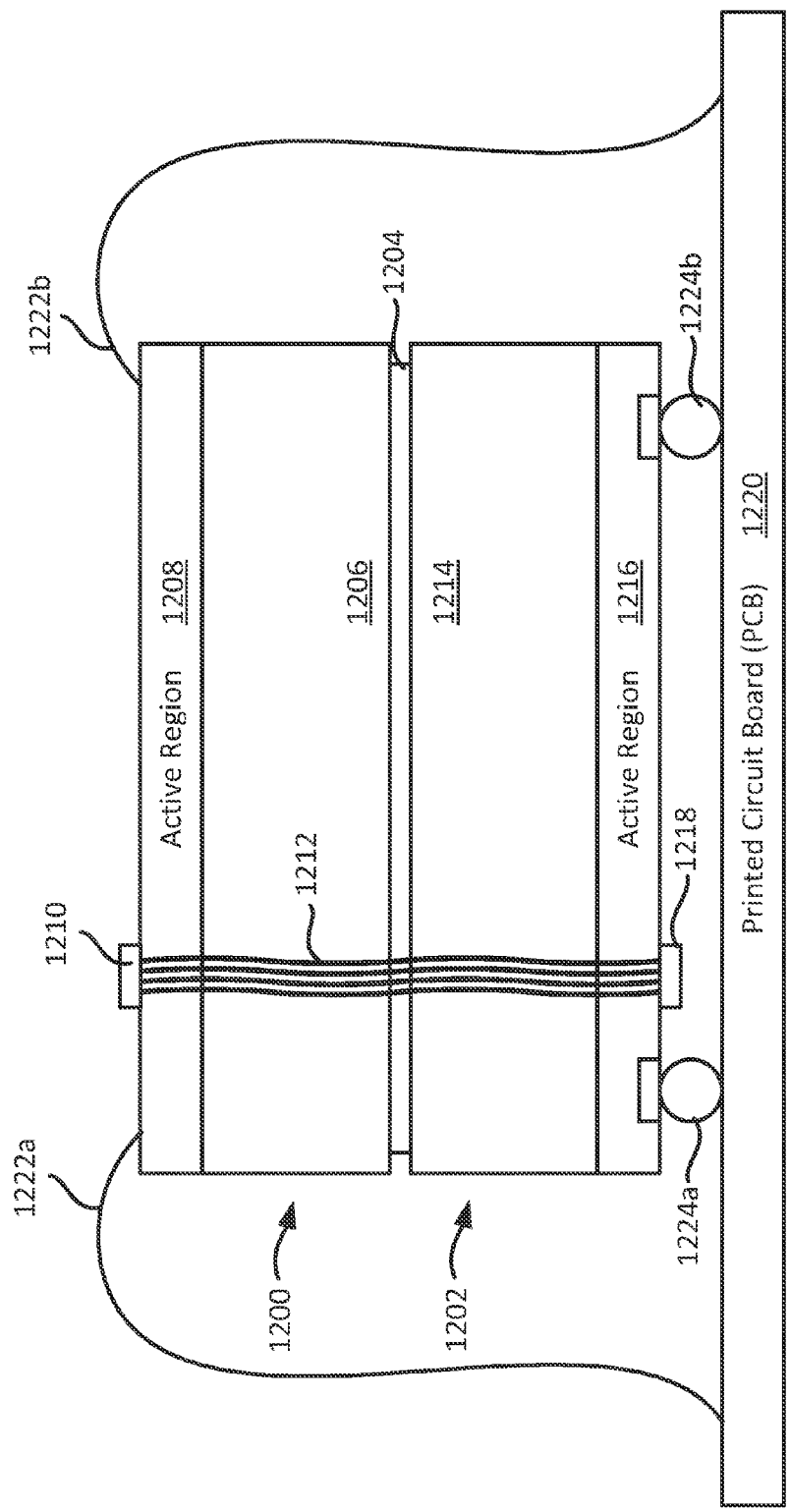
FIG. 12 illustrates two dice coupled together using through silicon optical interconnects.

FIG. 12 illustrates another implementation for using optical interconnects to couple two dice. For purposes of clarity and simplicity, only some of the components will be discussed. FIG. 12 illustrates a first die 1200, a second die 1202, and a printed circuit board (PCB) 1220. As shown in FIG. 12, the first die 1200 is physically coupled to the second die 1202 with a bonding material 1204. The bonding material 1204 is a material that allows light to pass through it. The first die 1200 includes a first region 1206 and a second region 1208. The first region 1206 may be made of silicon. In some implementations, the first region 1206 may be referred to as the back side of the die 1200 (the back side of the die may also be referred to as the die substrate). The second region 1208 is an active region. The active region 1208 is coupled to an optical emitter 1210. The optical emitter may be capable of transmitting optical signal 1212. The first die 1200 is electrically coupled to the PCB 1220 through wire bonds 1222a-b. In some implementations, the wire bonds 1222a-b provide power signals to the first die 1200.

The second die 1202 includes a first region 1214 and a second region 1216. The first region 1214 may be made of silicon. In some implementations, the first region 1214 may be referred to as the back side of the die 1202 (the back side of the die may also be referred to as the die substrate). The second region 1216 is an active region. The active region 1216 may be coupled to an optical receiver 1218. The optical receiver 1218 is for detecting and/or receiving an optical signal (e.g., optical signal 1212) through the first region 1206 of the first die 1200 and the first region 1214 of the second die 1202. The optical receiver 1218 may be integrated into the second region 1216 of the second die 1202 in some implementations. As shown in FIG. 12, the second die 1202 is electrically coupled to the PCB 1220 through solder bumps 1224a-b. In some implementations, power signals to the second die 1202 are provided through the solder bumps 1224a-b. Thus, in this implementation, optical signals traverse two active regions (e.g., part or all of the active region of a first die, and part or all of the active region of a second die) before it is received by an optical receiver. In some implementations, in order for the optical signal to be successfully transmitted from one die to another die, the signal path of the optical signal must be sufficiently thin (e.g., transparent) such that it allows enough light to pass through. In some implementations, in order for the optical signal to be successfully transmitted from one die to another die, the signal path of the optical signal must have a sufficiently low absorption rate such that it allows enough light to pass through (e.g., the absorption rate of the material through which the optical signal traverses must be low enough to allow enough light to pass through. As shown in FIG. 12, the optical signal transverses the optical path from the emitter 1210 through the active region 1208 of the first die 1200, through the first region (e.g., substrate region) 1206 of the first die 1200, through the bonding material 1204, and then through the first region (e.g., the substrate region) 1214 of the second die into the active region 1216 of the second die 1202 and finally into the optical receiver 1218.

Exemplary Optical Interconnect using Reflective Component

Figure 13:
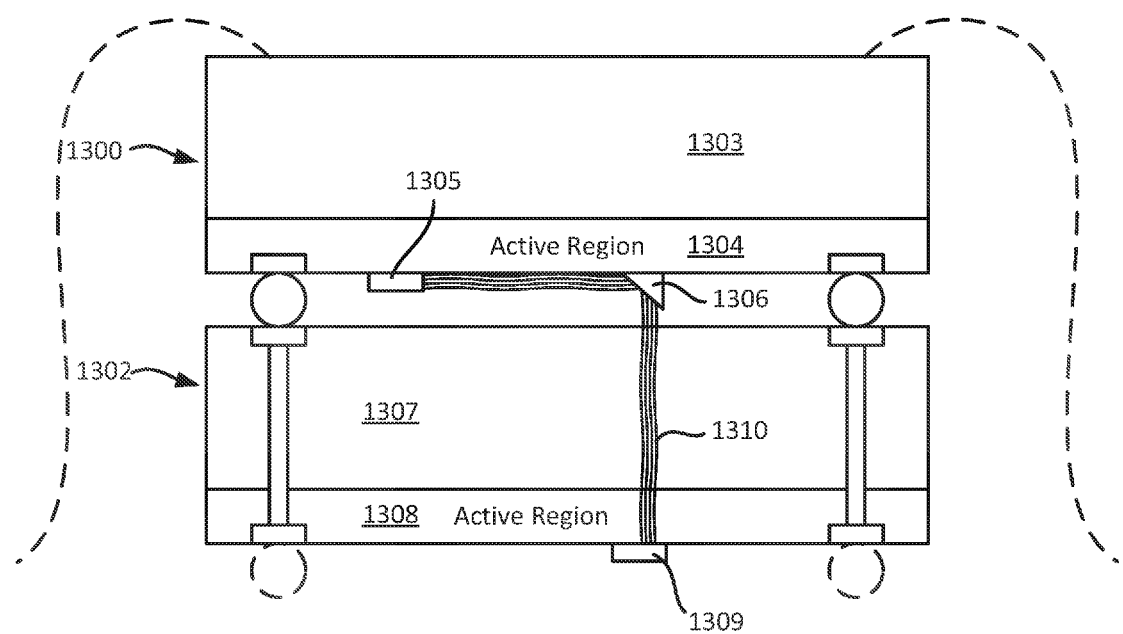
FIG. 13 illustrates two dice coupled together using through silicon optical interconnects with a reflective component.

FIG. 13 illustrates yet another implementation for using optical interconnects for connecting two dice. FIG. 13 is similar to FIG. 2, except that FIG. 13 also includes a reflective component (e.g., mirror) for directing/reflecting optical signals from an optical emitter. Specifically, FIG. 13 illustrates a first die 1300 and a second die 1302.

The first die 1300 includes a first region 1303 and a second active region 1304. The first region 1303 may be made of silicon. In some implementations, the first region 1303 may be referred to as the back side of the die 1300 (the back side of the die may also be referred to as the die substrate). An optical emitter 1305 and a reflective component 1306 (e.g., mirror) are coupled to the first die 1300. The optical emitter 1304 and the reflective component 1306 may be part of the die 1300 (e.g., part of the active region of the die) or they may be separate components of the die 1300. An optical receiver 1308 is coupled to the second die 1302. The second die 1302 includes a first region 1307 and a second active region 1308. The first region 1307 may be made of silicon. In some implementations, the first region 1307 may be referred to as the back side of the die 1302 (the back side of the die may also be referred to as the die substrate). The optical emitter 1305 is configured to transmit an optical signal (e.g., optical signal 1310) to the reflective component 1306. The reflective component 1306 directs/reflects the optical signal so that the optical receiver 1309 in the second die 1302 may receive it.

Figure 14:
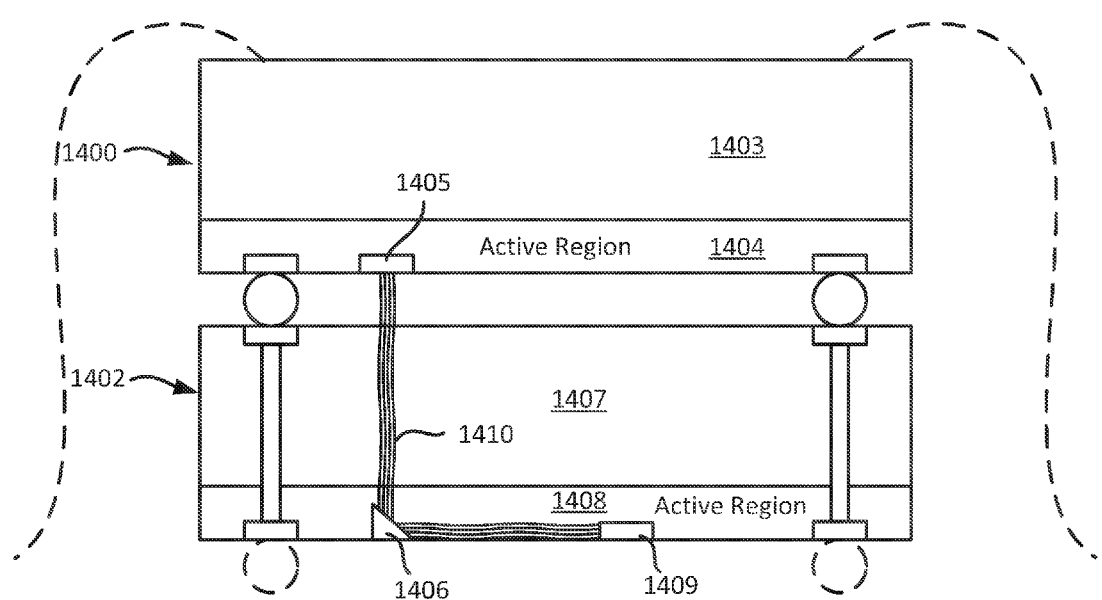
FIG. 14 illustrates two dice coupled together using through silicon optical interconnects with a reflective component.

FIG. 14 illustrates yet another implementation for using optical interconnects for connecting two dice. FIG. 14 is similar to FIG. 2, except that FIG. 14 also includes a reflective component (e.g., mirror) for directing/reflecting optical signals from an optical emitter. Specifically, FIG. 14 illustrates a first die 1400 and a second die 1402. The first die 1400 includes a first region 1403 and a second active region 1404. The first region 1403 may be made of silicon. In some implementations, the first region 1403 may be referred to as the back side of the die 1400 (the back side of the die may also be referred to as the die substrate). An optical emitter 1305 is coupled to the first die 1400. A reflective component 1406 (e.g., mirror) and an optical receiver 1308 are coupled to the second die 1402. The second die 1402 includes a first region 1407 and a second active region 1408. The first region 1407 may be made of silicon. In some implementations, the first region 1407 may be referred to as the back side of the die 1402 (the back side of the die may also be referred to as the die substrate). The reflective component 1406 and the optical receiver 1409 may be part of the second die 1402 or they may separate components of the second die 1402 in some implementations. The optical emitter 1404 is configured to transmit an optical signal (e.g., optical signal 1410) to the reflective component 1406 of the second die 1402. The reflective component 1406 directs/reflects the optical signal so that the optical receiver 1408 in the second die 1402 may receive it in some implementations.

FIGS. 13-14 illustrate the use of one reflective component (e.g., reflective component 1306, reflective component 1406). However, in some implementations, multiple reflective components may be used. In some implementations, an optical signal may be reflected through several reflective components. For example, an optical signal from an optical emitter may reflect through a series of reflective components (e.g., first reflective component, second reflective component, third reflective component) before the optical signal reaches an optical receiver. These reflective components may be located on one of the die, or on a combination of the two dice.

In addition, a reflective component may scatter the optical signal in some implementations. In such an implementation, the reflective component may separate/break up the optical signal in various optical signals, with at least one separated optical signal directed to a different transmitter than another separated optical signal. For example, an emitter may transmit an optical signal to a reflective component, which scatters/separates the optical signal, whereby a first separated optical signal is directed in a first direction (e.g., to a first receiver), while a second separated optical signal is directed in a second direction (e.g., to a second receiver). Different implementations may scatter the optical signals differently. In some implementations, the optical signal may be scattered in more than two directions (e.g., to more than two receivers).

FIGS. 2-14 illustrate examples of various positions for the optical emitters, optical receivers and/or reflective components. It should be noted that the optical emitters, optical receivers and/or reflective components may be placed anywhere in and/or around the die. In addition, the positions of the optical emitters may be interchanged with the position of the optical receivers.

FIGS. 2-14 illustrate examples of optical interconnects between two dice (e.g., optical signals between two dice) without any intervening die. However, in some implementations, one or more optical interconnects may exist between two dice, with at least one intervening die in between. For example, an optical signal from an emitter on a first die to a receiver on a second die may traverse a third die that is located between the first die and the second die. In such an instance, the optical signal may traverse several active regions and/or back layer regions.

Figure 15:
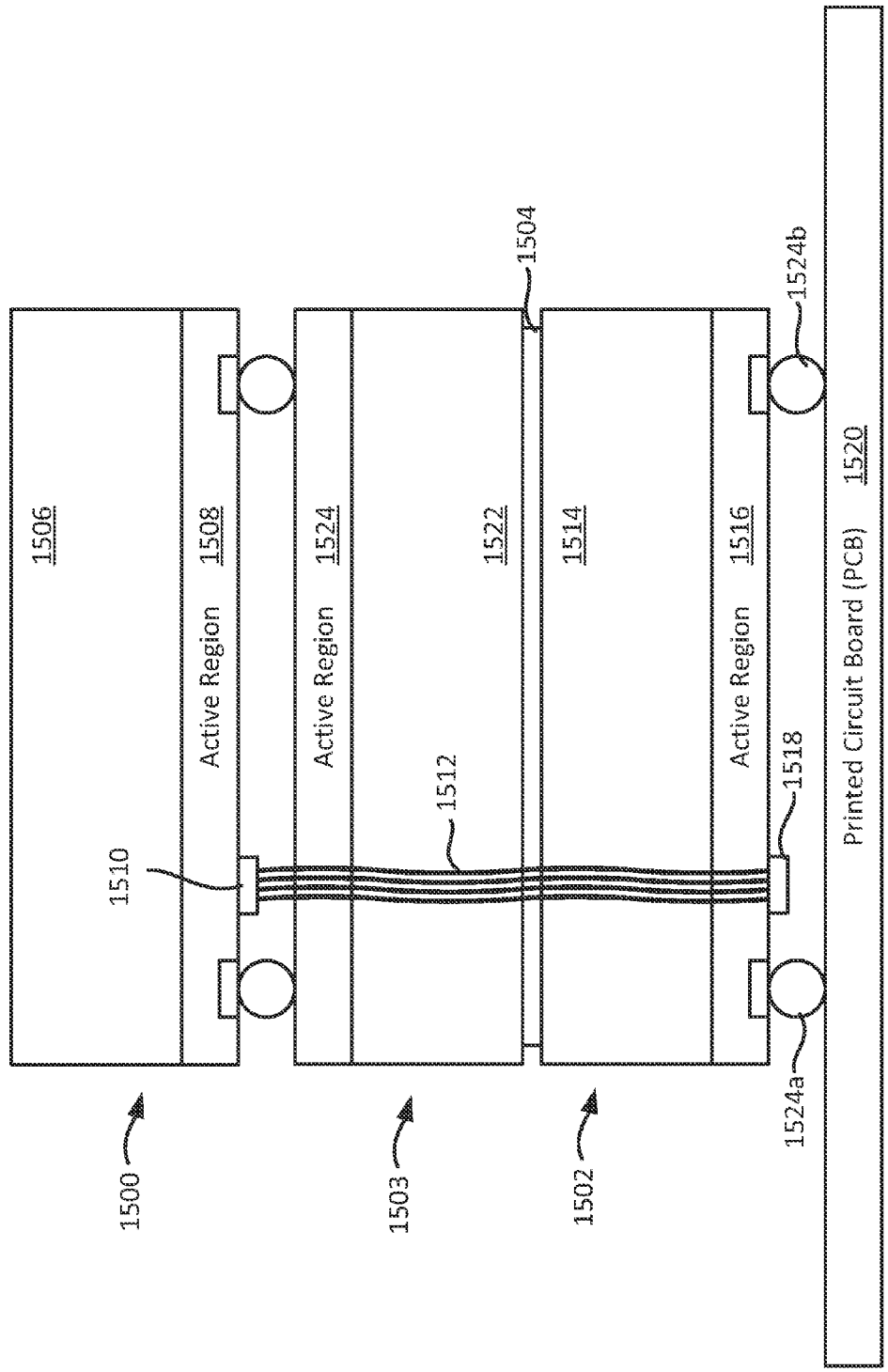
FIG. 15 illustrates three dice coupled together using through silicon optical interconnects.

FIG. 15 illustrates an example of using optical interconnects between two dice and intervening die between the two dice. For purposes of clarity and simplicity, only some of the components will be discussed. FIG. 15 illustrates a first die 1500, a second die 1502, a third die 1503 and a printed circuit board (PCB) 1520. As shown in FIG. 15, the first die 1500 is coupled to the third die 1503, and the third die 1503 is coupled to the second die 1502 with a bonding material 1504. The bonding material 1504 is a material that allows light to pass through it. The first die 1500 includes a first region 1506 and a second region 1508. The first region 1506 may be made of silicon, in some implementations, the first region 1506 may be referred to as the back side of the die 1500 (the back side of the die may also be referred to as the die substrate). The second region 1508 is an active region. The active region 1508 is coupled to an optical emitter 1510. The optical emitter may be capable of transmitting optical signal 1512. The first die 1500 is electrically coupled to the PCB 1520 through wire bonds (not shown). In some implementations, the wire bonds provide power signals to the first die 1500.

The second die 1502 includes a first region 1514 and a second region 1516. The first region 1514 may be made of silicon. In some implementations, the first region 1514 may be referred to as the back side of the die 1502 (the back side of the die may also be referred to as the die substrate). The second region 1516 is an active region. The active region 1516 may be coupled to an optical receiver 1518. The optical receiver 1518 is configured to detect and/or receive an optical signal (e.g., optical signal 1512).

The third die 1503 includes a first region 1522 and a second region 1524. The first region 1522 may be made of silicon. In some implementations, the first region 1522 may be referred to as the back side of the die 1503 (the back side of the die may also be referred to as the die substrate). The second region 1524 is an active region.

As shown in FIG. 15, the optical receiver 1518 is configured to detect and/or receive an optical signal (e.g., optical signal 1512) through the third die 1503 (i.e., first region 1522 and second region 1524) and the first region 1514 of the second die 1502. The optical receiver 1518 may also receive the optical signal through the second region 1516 of the second die 1502. The optical receiver 1518 may be integrated into the second region 1516 of the second die 1502 in some implementations. As further shown in FIG. 15, the second die 1502 is electrically coupled to the PCB 1520 through solder bumps 1524a-b. In some implementations, power signals to the second die 1502 are provided through the solder bumps 1524a-b. Thus, in this implementation, optical signals traverse two active regions (e.g., part or all of the active region of a first die, and part or all of the active region of a second die) before it is received by an optical receiver. In some implementations, in order for the optical signal to be successfully transmitted from one die to another die, the signal path of the optical signal must be sufficiently thin (e.g., transparent) such that it allows enough light to pass through. In some implementations, in order for the optical signal to be successfully transmitted from one die to another die, the signal path of the optical signal must have a sufficiently low absorption rate such that it allows enough light to pass through (e.g., the absorption rate of the material through which the optical signal traverses must be low enough to allow enough light to pass through.

As shown in FIG. 15, the optical signal transverses the optical path from the emitter 1510 through the active region 1524 of the third die 1503, through the first region (e.g., substrate region) 1522 of the third die 1503, through the bonding material 1504, and then through the first region (e.g., the substrate region) 1514 of the second die into the active region 1516 of the second die 1502 and finally into the optical receiver 1518. Thus, in the example shown in FIG. 15, the cumulative absorption rate of all the materials through which the optical signal passes must be low enough to allow the optical signal to traverse from the emitter to the receiver, in some implementations. The absorption rate and/or cumulative absorption rate described above for FIG. 15 may also be applicable to the implementations described in FIGS. 2-14, as well as any other implementations described in the disclosure.

One advantage of the various implementations described in the present disclosure is that it may avoid and/or bypass the use of an optical waveguide in a die. An optical waveguide is difficult to built in a die (e.g., in the active region of the die). Thus, by avoiding and/or bypassing the optical waveguide, the die is much easier and cheaper to manufacture.

It should also be noted that the emitters may transmit optical signals at the same frequency or at different frequency. For example, a first set of emitters may transmit at a first frequency, while a second set of emitters may transmit at a second frequency, and so on and so forth. Similarly, the receivers may be configured to receive optical signals at any frequency or only for a certain set of frequency. Different implementations, may use different combinations of emitters and receivers that are configured to transmit and/or receive different optical signal at different frequencies.

Having described various optical emitters and optical receivers, a method for manufacturing dices that are coupled together using through silicon optical interconnects will now be described below.

Figure 16:
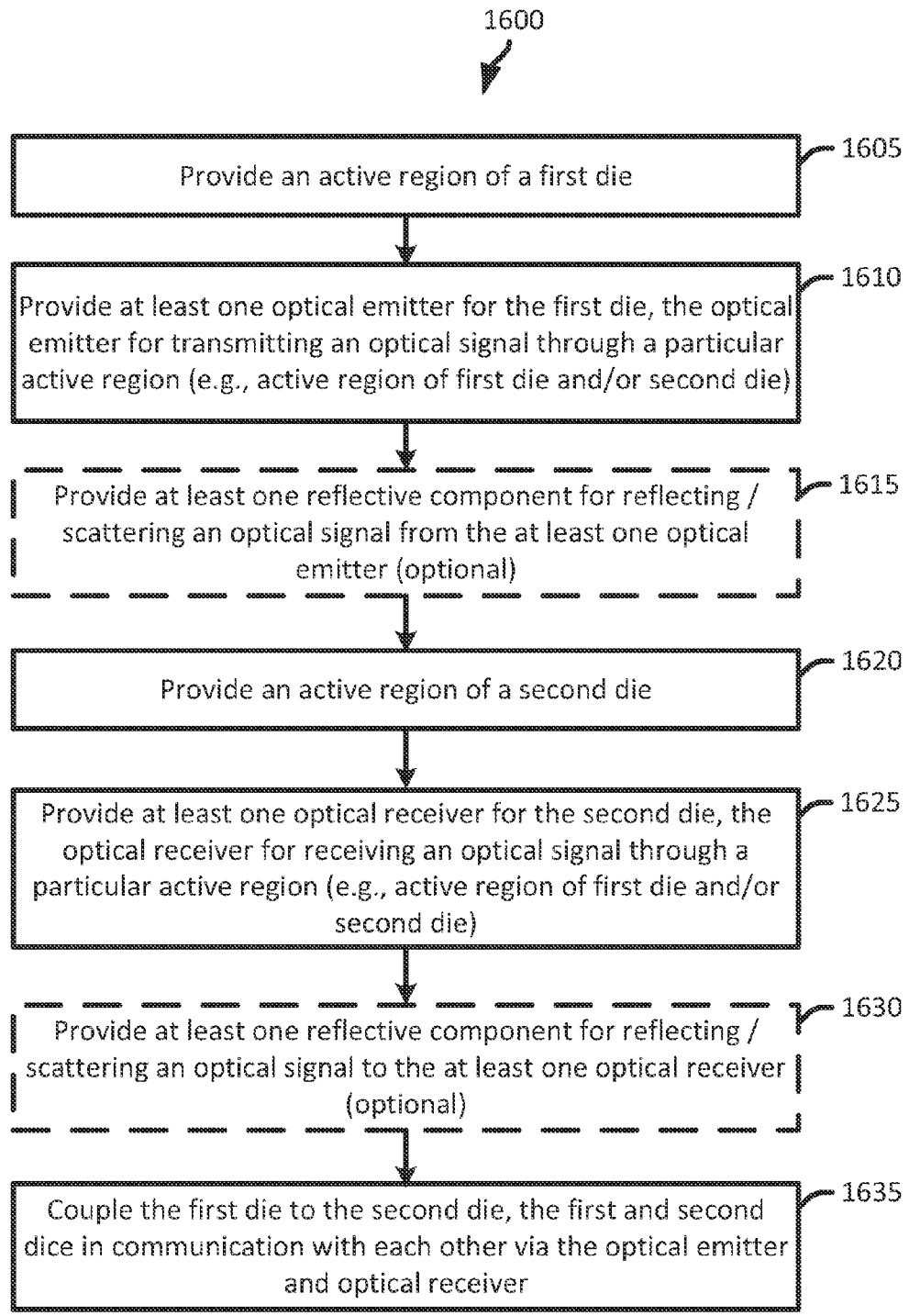
FIG. 16 illustrates a flow diagram of a method for manufacturing two dice coupled together using through silicon optical interconnects.

Exemplary Method for Manufacturing Dice with Through Silicon Optical Interconnects FIG. 16 illustrates a flow diagram of a method for manufacturing/providing a dice that are coupled together using through silicon optical interconnects.

The method begins by providing (at 1605) an active region of a first die. In some implementations, providing an active region of a die may include defining/manufacturing active and passive devices (e.g., transistors), conductive layers (e.g., metal layers) and dielectric layers on a die.

Next, the method provides (at 1610) at least one optical emitter for the first die. In some implementations, the optical emitter is configured to transmit an optical signal through an active region and/or inactive region (e.g., back side/substrate) of one or more dice. For example, the optical emitter may be configured to transmitting an optical signal through the active region and/or inactive region of the first die and/or another die (e.g., second die) that may be coupled to the first die. In some implementations, providing the optical emitter may include manufacturing the optical emitter in the active region of the first die.

The method may then optionally provide (at 1615) at least one reflective component for the first die. The reflective component may be a mirror. In some implementations, the reflective component is for reflecting and/or scattering an optical signal from the at least one optical emitter. The reflective component may be part of the active region of the first die in some implementations.

After providing (at 1610) the optical emitter(s) or providing (at 1615) the reflective component(s), the method provides (at 1620) an active region for a second die. As in the case of the first die, providing the active region for the second die may include defining/manufacturing active and passive devices (e.g., transistors), conductive layers (e.g., metal layers) and dielectric layers on the second die.

Next, the method provides (at 1625) at least one optical receiver for the second die. The optical receiver may be defined/manufactured in the active region of the second die. The optical receiver is configured to receive an optical signal through one or more active regions of one or more dice (e.g., active region of the first die and/or active region of the second die) and/or one or more inactive region of one or more dice (e.g., substrate region/back side region).

After providing (at 1625) at least one optical receiver for the second die, the method may optionally provide (at 1630) at least one reflective component (e.g., mirror) for reflecting/scattering an optical signal to the at least one optical receiver of the second die. The reflective component may be part of the active region of the second die in some implementations.

The method then couples (at 1635) the first die to the second die and ends. The first die and the second die may be coupled together such that the first die and the second die are in communication with each other via at least the optical emitter and the optical receiver. In some implementations, coupling the first die and the second die includes assembling the first die to the second die.

Exemplary Method for Calibration of Through Silicon Optical Interconnects

Figure 17:
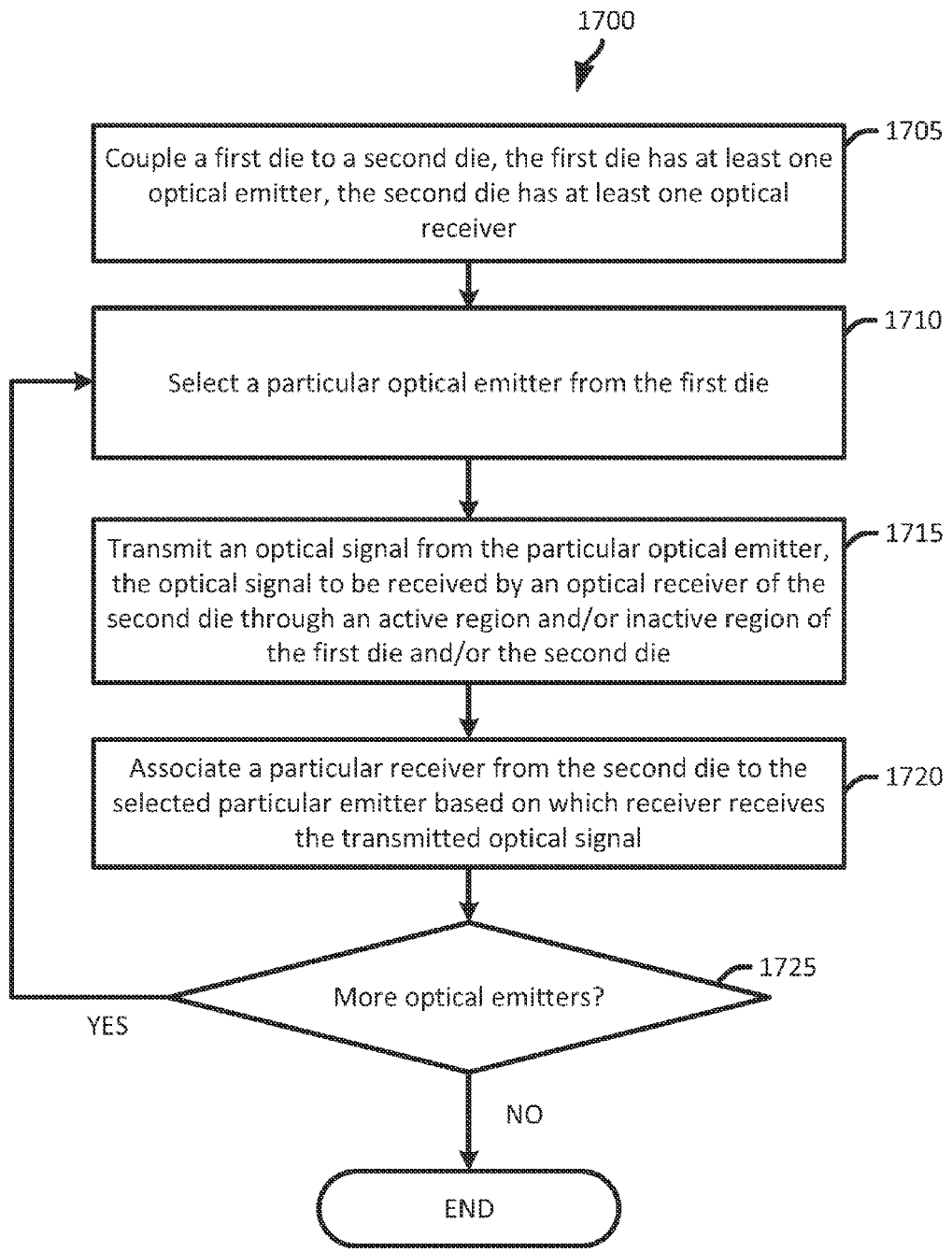
FIG. 17 illustrates a flow diagram of a method for calibrating through silicon optical interconnects between two dices.

FIG. 17 illustrates an exemplary flow diagram of a method for calibration of through silicon optical interconnects. In some implementations, some or all of the method of FIG. 17 may be implemented in the method of manufacturing/providing dice that are coupled together using through silicon optical interconnects described above in FIG. 16.

The method begins by coupling (at 1705) a first die to the second die. The first die includes at least one optical emitter and the second die includes at least one optical receiver. The first die and the second die may be coupled together such that the first die and the second die are in communication with each other via at least the optical emitter and the optical receiver. In some implementations, coupling the first die and the second die includes assembling the first die to the second die.

Next, the method selects (at 1710) a particular optical emitter from the first die. After selecting (at 1710) the particular optical emitter, the method transmits (at 1715) an optical signal from the selected optical emitter. In some implementations, the optical signal may be transmitted through one or more active regions of one or more dice (e.g., active region of first and/or second die). In some implementations, the optical signal may be transmitted through one or more inactive regions of one or more dice (e.g., substrate region/back side region).

After transmitting (at 1715) the optical signal, the method associates (at 1720) the selected optical emitter (e.g., the optical emitter that sent the optical signal) to the optical receiver (e.g., optical sensor) on the second die that received the transmitted optical signal.

Next, the method determines (at 1725) whether there are more optical emitters. If yes, the method proceeds back to 1710 to select another optical emitter from the first die. In some implementations, several iterations of selecting an optical emitter, transmitting an optical signal from an optical emitter and associating the selecting optical emitter to an optical receiver may be performed.

The method ends after determining (at 1725) there are no other optical emitters. In some implementations, the above method describes a calibration method that allows two or more dice to be optically coupled together after assembly (e.g., physical coupling of two or more dice). The part of or all of the method of FIG. 17 may be performed by the first die, the second die, and/or a third die (e.g., a third processor). In some implementations, the part of or all of the method of FIG. 17 may be performed by several dice (e.g., first and second dice). Moreover, the part of or all of the method of FIG. 17 may be performed by an external apparatus and/or machine (e.g., testing machine).

Optical Device with Transmitting and Receiving Functionalities

In the present disclosure, optical transmitters (e.g., emitters) and optical receivers are described as separate optical devices/apparatuses. However, in some implementations, these optical devices may have both optical transmitting and optical receiving capabilities and/or functionalities. That is, in some implementations, an optical transmitter can transmit/emit an optical signal and receive/detect an optical signal. Similarly, in some implementations, an optical receiver can receive/detect an optical signal as well as transmit/emit an optical signal. These dual functionality optical devices may be referred to as a bi-directional optical device (e.g., bi-directional transmitter/receiver) in some implementations.

These dual functionality optical devices may be configurable and may be applied/used in any of the optical transmitters and receivers described in the present disclosure (including the various methods described in the disclosure). For example, in some implementations, a first die may have a first dual purpose/functionality optical device (e.g., transmitter that can emit and receive optical signal), while a second die optically coupled to the first die may have a first optical receiver and/or a first optical transmitter. In addition, in some implementations, a first die and a second die that are optically coupled together may each have a dual purpose/functionality optical device.

Figure 18:
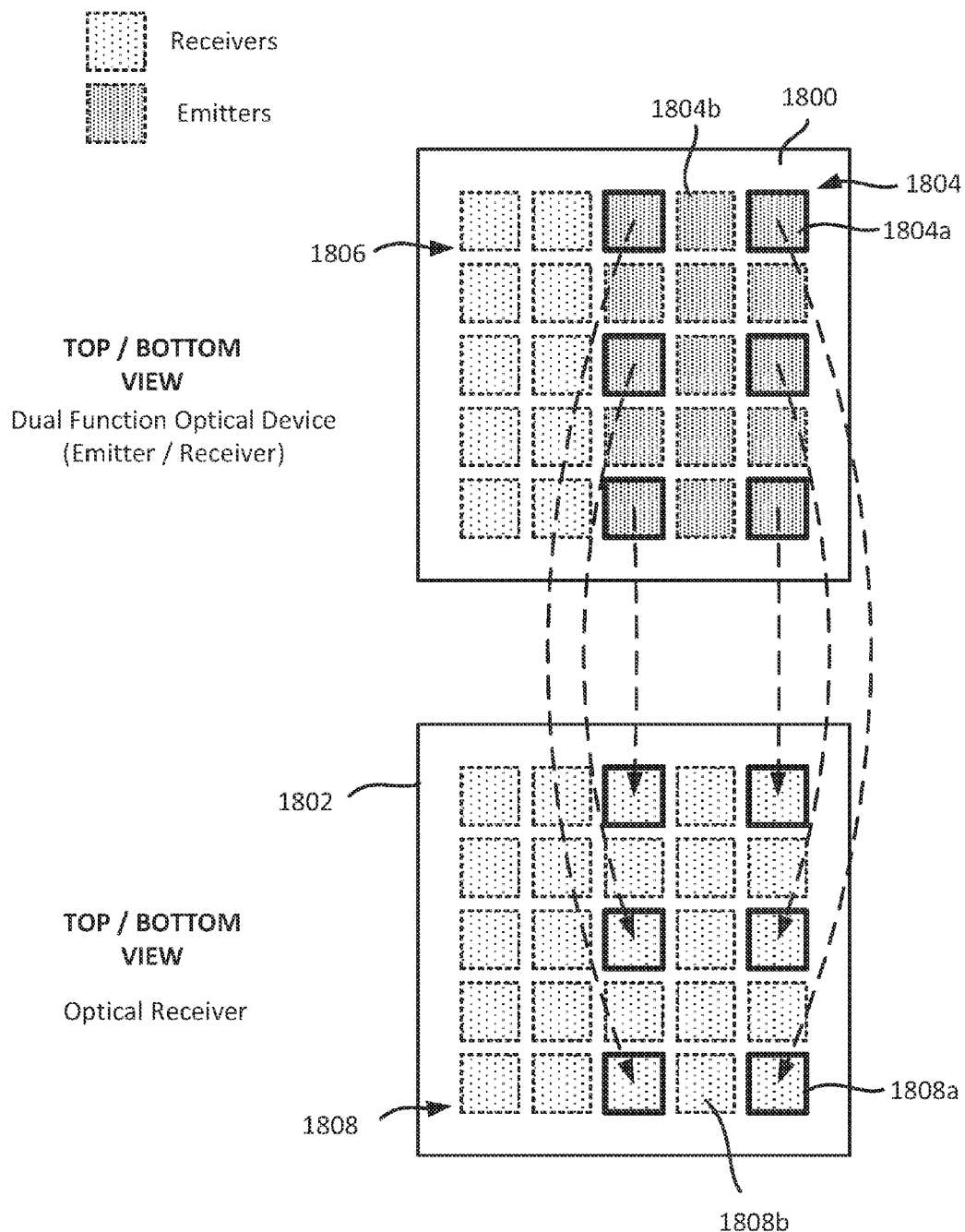
FIG. 18 illustrates a combination of a dual functionality optical device with a optical receiver.
Figure 19:
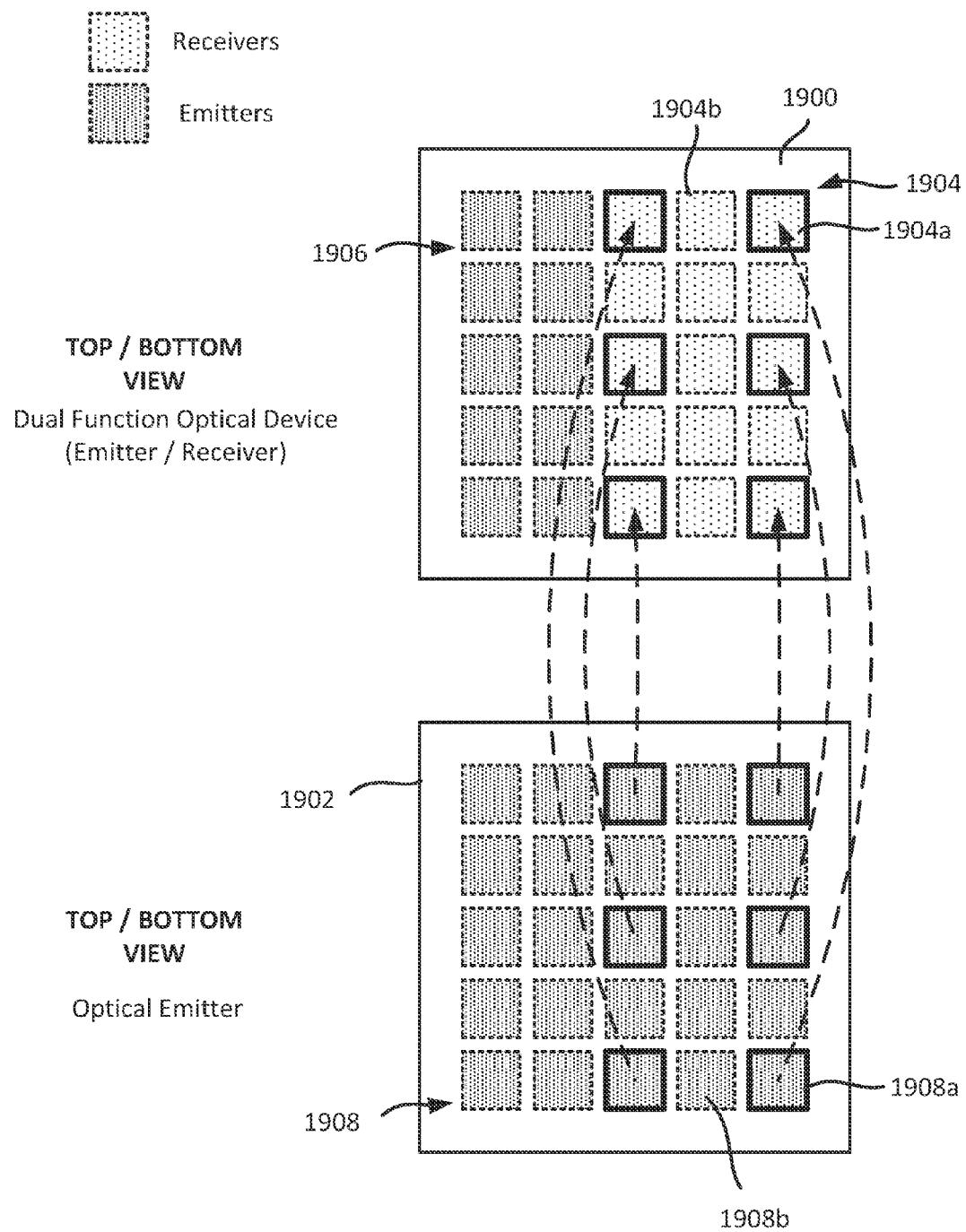
FIG. 19 illustrates a combination of a dual functionality optical device with a optical emitter.
Figure 20:
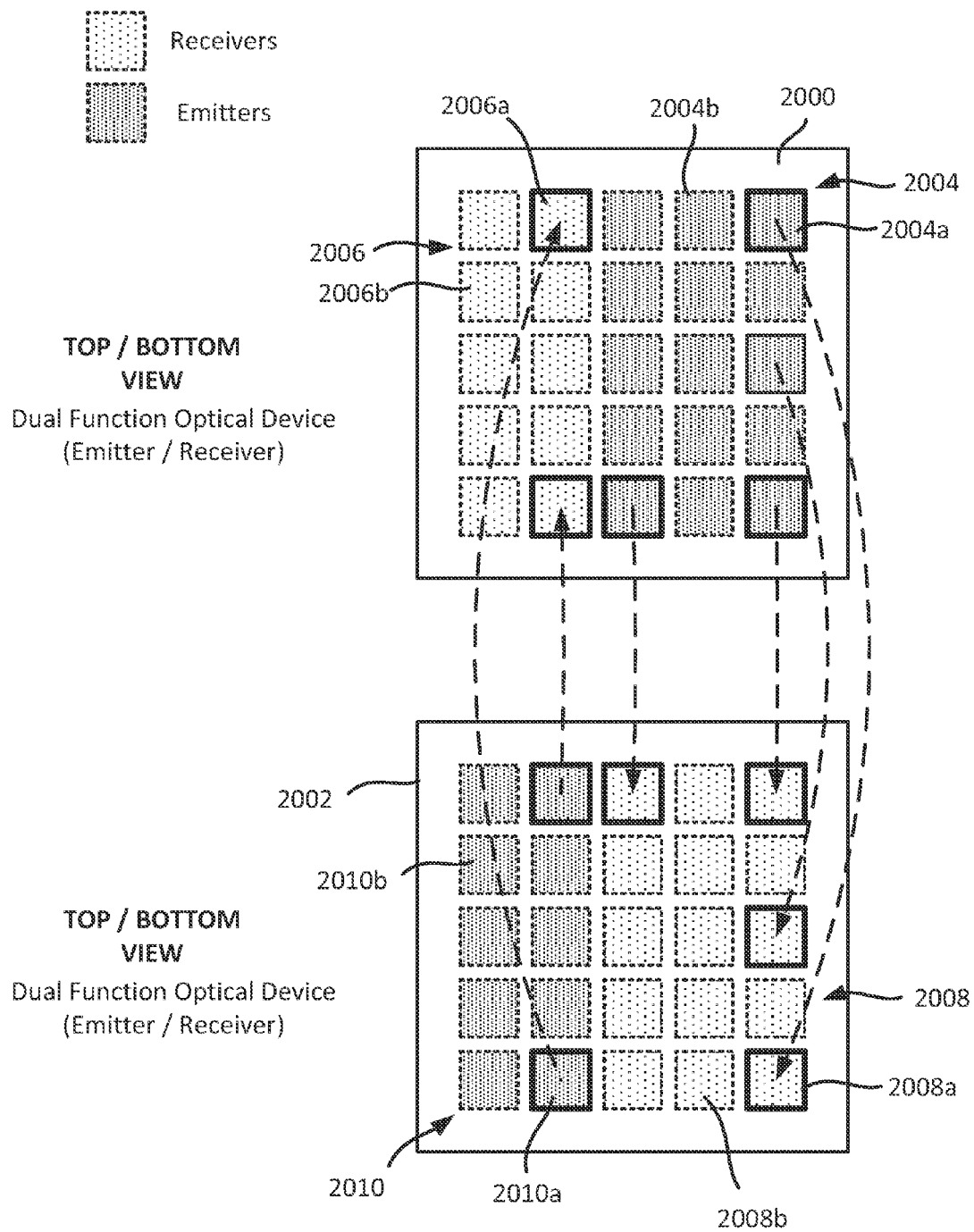
FIG. 20 illustrates a combination of two dual functionality optical devices.

FIGS. 18-20 illustrate various examples of the use of one or more dual functionality optical devices in some implementations.

FIG. 18 illustrates the combination of a dual functionality optical device 1800 on a first die with an optical receiver 1802 on a second die. As shown in FIG. 18, the optical device 1800 includes several emitters 1804 and several receivers 1806. The optical receiver 1802 includes several receivers 1808. The emitters are represented by a darker shading than the receivers. The optical device 1800 is configured to function as an optical transmitter, where one or more optical signals from some or all of the emitters 1804 are transmitted to one or more receivers 1808 of the optical receiver 1802. In the example of FIG. 18, the optical receivers 1806 of the optical device 1800 are inactive because the optical device 1800 is configured to operate as an optical transmitter. Active emitters and receivers are represented by a thick outline. Inactive emitters and receivers are represented by a dashed outline.

As shown in FIG. 18, a first active optical emitter 1804a is configured to transmit an optical signal to a first optical receiver 1808a. In some implementations, some of the optical emitters 1804 (e.g., optical emitter 1804b) are inactive. In some implementations, inactive optical emitters are emitters that do not transmit an optical signal to a corresponding optical receiver. In some implementations, inactive optical emitters may be optical emitters that are not associated with a corresponding optical receiver. An optical emitter (e.g., optical emitter 1804b) may be inactive for various reasons, including not being aligned with a corresponding optical receiver, not working (e.g., faulty), or the optical emitter is not needed to provide an optical interconnect/connection between the two dice. Similarly, as mentioned above, an optical receiver (e.g., optical receiver 1808b) may also be inactive. In some implementations, inactive optical receivers may be optical receivers that are not associated with a corresponding optical emitter. An optical receiver (e.g., optical receivers 1806) may be inactive for various reasons, including not being aligned with a corresponding optical emitter, not working (e.g., faulty), or the optical receiver is not needed to provide an optical interconnect/connection between the two dice.

FIG. 19 illustrates the combination of a dual functionality optical device 1900 on a first die with an optical transmitter 1902 on a second die. As shown in FIG. 19, the optical device 1900 includes several receivers 1904 and several emitters 1906. The optical transmitter 1902 includes several emitters 1908. The emitters are represented by a darker shading than the receivers. The optical device 1900 is configured to function as an optical receiver, where one or more optical signals (e.g., from emitters 1908 of the optical transmitter 1902) can be received/detected by some or all of the receivers 1904 of the optical device 1900. In this example, the optical emitters 1906 are inactive because the optical device 1900 is configured to operate as an optical receiver. Active emitters and receivers are represented by a thick outline. Inactive emitters and receivers are represented by a dashed outline.

As shown in FIG. 19, a first active optical receiver 1904a is configured to receive an optical signal from a first optical emitter 1908a. In some implementations, some of the optical receivers 1904 (e.g., optical receiver 1904b) are inactive. In some implementations, inactive optical receivers are receivers that do not receive an optical signal from a corresponding optical emitter. In some implementations, inactive optical receivers may be optical receivers that are not associated with a corresponding optical emitter. An optical receiver (e.g., optical receiver 1904b) may be inactive for various reasons, including not being aligned with a corresponding optical emitter, not working (e.g., faulty), or the optical receiver is not needed to provide an optical interconnect between the two dice. Similarly, as described above, an optical emitter (e.g., optical emitter 1908b) may also be inactive. In some implementations, inactive optical emitters may be optical emitters that are not associated with a corresponding optical receiver. An optical emitter (e.g., optical receivers 1906) may be inactive for various reasons, including not being aligned with a corresponding optical receiver, not working (e.g., faulty), or the optical emitter is not needed to provide an optical interconnect between the two dice.

FIG. 20 illustrates the combination of a first dual functionality optical device 2000 on a first die with a second dual functionality optical device 2002 on a second die. As shown in FIG. 20, the first optical device 2000 includes several emitters 2004 and several receivers 2006. The second optical device 2002 includes several receivers 2008 and several emitters 2010. The emitters are represented by a darker shading than the receivers. The first optical device 2000 is configured to function as an optical transmitter and as an optical receiver. The second optical device 2002 is also configured to function as an optical transmitter and as an optical receiver. However, in some implementations, one of the optical devices may be configured to operate as an optical transmitter, while the other optical device is configured to operate as an optical receiver.

FIG. 20 illustrates that some of the emitters (e.g., emitter 2004*b*, 2010*b*) from optical devices 2000-2002 are inactive. Similarly, some of the receivers (e.g., receivers 2006*b*, 2008*b*) are inactive. Emitters and receivers may be inactive for various reasons, including the reasons described above in FIGS. 18-19. Active emitters and receivers are represented by a thick outline. Inactive emitters and receivers are represented by a dashed outline.

As shown in FIG. 20, a first set of optical emitters on the optical device 2000 is configured to transmit one or more optical signals to a first set of optical receivers on the optical device 2002. For example, a first active optical emitter 2004*a* (on the optical device 2000) is configured to transmit an optical signal to a first optical receiver 2008*a* (on the optical device 2002). Similarly, the first set of optical receivers on the optical device 2002 is configured to receive/detect one or more optical signals from the first set of optical emitters on the optical device 2000. For example, the first active optical receiver 2008*a* (on the optical device 2002) is configured to receive/detect an optical signal from the first optical emitter 2004*a* (on the optical device 2000).

In addition, a second set of optical emitters on the optical device 2002 is configured to transmit one or more optical signals to a second set of optical receivers on the optical device 2000. For example, a second active optical emitter 2010*a* (on the optical device 2002) is configured to transmit an optical signal to a second optical receiver 2006*a* (on the optical device 2000). In addition, the second set of optical receivers on the optical device 2000 is configured to receive/detect one or more optical signals from the second set of optical emitters on the optical device 2002. For example, the second active optical receiver 2006*a* (on the optical device 2000) is configured to receive/detect an optical signal from the second optical emitter 2010*a* (on the optical device 2002).

FIGS. 18-20 also illustrate how optical devices, emitters and/or optical receivers may be configurable after the two dice are coupled to each other. Since these optical devices, emitters and optical receivers are configurable, the placement of the optical devices, emitters and/or optical receivers on their respective die does not have to be as accurate and/or precise if the optical devices, optical emitters and/or optical receivers were not configurable. Since, the alignment, calibration, and/or configuration is done after the dice are coupled (e.g., physically coupled) to each other, the alignment, calibration, and/or configuration of the optical devices, emitters and/or optical receivers can take into account any misalignment of the dice. In some implementations, the ability to calibrate, adjust and/or configure the optical devices, emitters and/or optical receivers will result in better manufacturing yields because dice that are not perfectly aligned may still be operational and/or functional. An example of a method for calibrating, configuring and/or adjusting optical devices, emitters and/or optical receivers was described above with reference to FIG. 17.

Exemplary Electronic Devices

Figure 21:
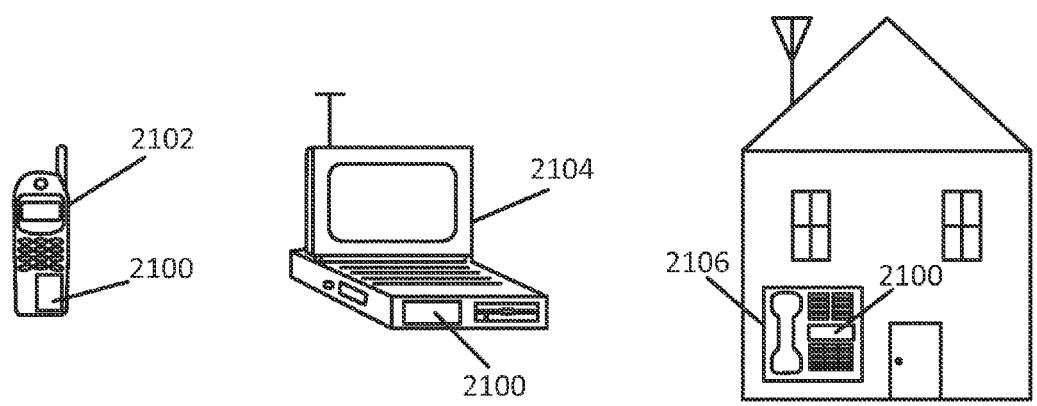
FIG. 21 illustrates various electronic devices that may integrate the IC described herein.

FIG. 21 illustrates various electronic devices that may be integrated with any of the aforementioned integrated circuit, die or package. For example, a mobile telephone 2102, a laptop computer 2104, and a fixed location terminal 2106 may include an integrated circuit (IC) 2100 as described herein. The IC 2100 may be, for example, any of the integrated circuits, dice or packages described herein. The devices 2102, 2104, 2106 illustrated in FIG. 21 are merely exemplary. Other electronic devices may also feature the IC 2100 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, the substrate of the die may be coupled to the packaging substrate even though the substrate of the die is never directly physically in contact with the packaging substrate.

The terms wafer and substrate may be used herein to include any structure having an exposed surface with which to form an integrated circuit (IC) according to aspects of the present disclosure. The term die may be used herein to include an IC. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art. The term "horizontal" is defined as a plane substantially parallel to the conventional plane or surface of a wafer or substrate, regardless of the orientation of the wafer or substrate. The term "vertical" refers to a direction substantially perpendicular to the horizontal as defined above. Prepositions, such as "on," "upper," "side," "higher," "lower," "over," and "under" when used with respect to the integrated circuits described herein are defined with respect to the conventional plane or surface being on the top surface of the wafer or substrate, regardless of the orientation of the wafer or substrate. The prepositions "on," "upper," "side," "higher," "lower," "over," and "under" are thereby defined with respect to "horizontal" and "vertical."

One or more of the components, steps, features, and/or functions illustrated in FIGS. 4, 5, 6, 7, 8, 9, 10, 11, 12, 14, 15, 16, 17, 18, 19, 20 and/or 21 may be rearranged and/or combined into a single component, step, feature or function or embodied in several components, steps, or functions. Additional elements, components, steps, and/or functions may also be added without departing from the invention.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
    a first die comprising:
        an active region comprising one or more transistors for the first die; and
        a back side layer coupled to the active region, the back side layer having a thickness that is sufficiently thin to allow an optical signal, transmitted from an optical emitter, to traverse through the back side layer; and
    an optical receiver configured to receive the optical signal through the back side layer of the first die and at least a portion of the active region of the first die, wherein the optical receiver is distinct from the active region of the first die.

2. The device of claim 1, wherein the optical signal originates from a corresponding optical emitter coupled to a second die.

3. The device of claim 1, wherein the back side layer is a die substrate.

4. The device of claim 3, wherein the optical signal traverses a substrate portion of the back side layer.

5. The device of claim 1, wherein the optical receiver is part of the active region of the first die.

6. The device of claim 1, wherein the active region includes at least one of an active device, a passive device, and/or a conductive layer.

7. The device of claim 1, wherein the optical receiver is separate from the first die, and wherein the optical receiver is located over the active region of the first die.

8. The device of claim 1, wherein the optical receiver comprises a plurality of optical sensors configured to receive a plurality of optical signals.

9. The device of claim 8, wherein the optical receiver is further configured to associate a particular optical signal from at least the plurality of optical signals with a particular optical sensor.

10. The device of claim 8, wherein a particular optical sensor is configured to identify optical signals received at its optical sensors as originating from a particular optical emitter.

11. The device of claim 1, further comprising a second die that includes an optical emitter and, wherein the second die is coupled to the back side layer of the first die.

12. The device of claim 1, further comprising:
    a second die that includes an optical emitter; and
    a third die located between the first die and the second die, wherein the optical receiver is configured to receive a particular optical signal through the third die.

13. The device of claim 1, further comprising a reflective component configured to reflect at least one optical signal to the optical receiver.

14. The device of claim 1, further comprising a reflective component configured to scatter at least one optical signal.

15. The device of claim 1, wherein the device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

16. A device comprising:
    a first die comprising:
        an active region comprising one or more transistors for the first die; and
        a back side layer coupled to the active region, the back side layer having a thickness that is sufficiently thin to allow an optical signal to traverse through the back side layer; and
    an optical emitter configured to transmit the optical signal to an optical receiver, the optical emitter configured to transmit the optical signal through the back side layer of the first die and at least a portion of the active region of the first die, wherein the optical emitter is distinct from the active region of the first die.

17. The device of claim 16, wherein the optical signal is destined to a corresponding optical emitter coupled to a second die.

18. The device of claim 16, wherein the back side layer is a die substrate.

19. The device of claim 18, wherein the optical signal traverses a substrate portion of the back side layer.

20. The device of claim 16, wherein the optical emitter is a part of the active region of the first die.

21. The device of claim 16, wherein the active region includes at least one of an active device, a passive device, and/or a conductive layer.

22. The device of claim 16, wherein the optical emitter is separate from the first die, and wherein the optical emitter is located over the active region of the first die.

23. The device of claim 16, wherein the optical emitter comprises a plurality of optical transmitters.

24. The device of claim 16, further comprising a second die that includes an optical receiver and, wherein the second die is coupled to the back side layer of the first die.

25. The device of claim 16, further comprising
    a second die that includes an optical receiver; and
    a third die located between the first die and the second die, wherein the optical emitter is configured to transmit a particular optical signal through the third die.

26. The device of claim 16, further comprising a reflective component configured to reflect at least one optical signal from the optical emitter.

27. The device of claim 16, further comprising a reflective component configured to scatter at least one optical signal.

28. The device of claim 16, wherein the optical transmitter is an optical device that is further configured to transmit a plurality of optical signals.

29. The device of claim 16, wherein the device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

30. An apparatus comprising:
   a first die comprising:
      an active region comprising one or more transistors for the first die; and
      a back side layer coupled to the active region, the back side layer having a thickness that is sufficiently thin to allow an optical signal, transmitted from a means for transmitting the optical signal, to traverse through the back side layer; and
   a means for receiving the optical signal through the back side layer of the first die and at least a portion of the active region of the first die, wherein the means for receiving the optical signal is distinct from the active region of the first die; and
   at least one through silicon via (TSV) configured for an electrical connection between the first die and a second die.

31. The apparatus of claim 30, wherein the active region includes at least one of an active device, a passive device, and/or a conductive layer.

32. The apparatus of claim 30, wherein the means for receiving comprises a plurality of optical sensors configured to receive at least a plurality of optical signals.

33. The apparatus of claim 32, wherein the means for receiving is further configured to associate a particular optical signal from at least the plurality of optical signals with a particular optical sensor.

34. The apparatus of claim 32, wherein a particular optical sensor is configured to identify optical signals received at its optical sensors as originating from a particular means for transmitting the optical signals.

35. The apparatus of claim 30, further comprising a means for reflecting at least one optical signal to the means for receiving.

36. The apparatus of claim 30, further comprising a means for scattering at least one optical signal.

37. The apparatus of claim 30, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

38. An apparatus comprising:
   a first die comprising:
      an active region comprising one or more transistors for the first die; and
      a back side layer coupled to the active region, the back side layer having a thickness that is sufficiently thin to allow an optical signal to traverse through the back side layer; and
   a means for transmitting the optical signal to a means for receiving the optical signal, the means for transmitting configured to transmit the optical signal through the back side layer of the first die and at least a portion of the active region of the first die, wherein the means for transmitting the optical signal is distinct from the active region of the first die; and
   a second die comprising at least one through silicon via (TSV) configured for an electrical connection between the first die and the second die.

39. The apparatus of claim 38, wherein the active region includes at least one of an active device, a passive device, and/or a conductive layer.

40. The apparatus of claim 38, further comprising a means for reflecting at least one optical signal from the means for transmitting.

41. The apparatus of claim 38, further comprising a means for scattering at least one optical signal.

42. The apparatus of claim 38, wherein the means for transmitting further comprises means for receiving a plurality of optical signals.

43. The apparatus of claim 38, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

44. A method for fabricating a device, the method comprising:
   providing a first die comprising (i) a first active region comprising one or more first transistors for the first die, and (ii) a first back side layer having a thickness that is sufficiently thin to allow an optical signal to traverse through the first back side layer;
   coupling a second die to the first die, the second die comprising (i) a second active region comprising one or more second transistors for the second die, and (ii) a second back side layer having a thickness that is sufficiently thin to allow an optical signal to traverse through the second back side layer, wherein coupling the second die to the first die comprises coupling the second die to the first die such that the first back side layer of the first die is facing the second back side layer of the second die;
   coupling an optical receiver to the first die, wherein the optical receiver is configured to receive at least one optical signal through the second back side layer of the second die, the first back side layer of the first die, and the first active region of the first die, wherein the optical receiver is distinct from the first active region of the first die; and
   providing at least one through silicon via (TSV) within the first die, the TSV configured for coupling to provide an electrical connection between the first die and the second die.

45. The method of claim 44, wherein the optical receiver is further configured to receive the optical signal through at least a portion of the first active region of the first die.

46. The method of claim 44, further comprising coupling an optical emitter to the second die.

47. The method of claim 44, further comprising providing a reflective component configured to reflect at least one optical signal to the optical receiver.

48. The method of claim 44, further comprising providing a reflective component configured to scatter at least one optical signal.

49. A method for fabricating a device, the method comprising:
   providing a first die comprising (i) a first active region comprising one or more first transistors for the first die, and (ii) a first back side layer having a thickness that is sufficiently thin to allow an optical signal to traverse through the first back side layer;
   coupling a second die to the first die, the second die comprising (i) a second active region comprising one or more second transistors for the second die, and (ii) a second back side layer having a thickness that is sufficiently thin to allow an optical signal to traverse through the second back side layer; and coupling an optical emitter to the first die, the optical emitter comprising a plurality of transmitters configured to transmit a plurality of optical signals through the first active region of the first die and the back side layer of the first die, wherein the optical emitter is distinct from the first active region of the first die; and providing at least one through silicon via (TSV) within the second die, the TSV configured for coupling to provide an electrical connection between the first die and the second die.

50. The method of claim 49, wherein the plurality of transmitters are further configured to transmit at least one optical signal from the plurality of optical signals through at least a portion of the first active region of the first die.

51. The method of claim 49, further comprising coupling an optical receiver to the second die, the optical receiver being configured to receive at least one optical signal from at least one transmitter from the plurality of transmitters.

52. The method of claim 49, further comprising providing a reflective component configured to reflect at least one optical signal from the optical emitter.

53. The method of claim 49, further comprising providing a reflective component configured to scatter at least one optical signal.

54. A method for calibrating at least one optical interconnect between a first die and a second die, the method comprising:

transmitting an optical signal from an emitter on the first die, wherein the emitter is configured to transmit the optical signal through a first active region of the first die and/or a second active region of the second die, the first active region comprising one or more first transistors, and the second active region comprising one or more second transistors; and associating a receiver from a plurality of receivers on the second die to the emitter on the first die based on which receiver from the plurality of receivers receives the transmitted optical signal from the emitter, wherein placement of the receiver and placement of the emitter are not aligned.

55. The method of claim 54, wherein the associating of the receiver on the second die to the emitter on the first die establishes an optical interconnect between the first die and the second die.

56. The method of claim 54, wherein the first die comprises a plurality of emitters.

57. The method of claim 56, further comprising iteratively performing the transmitting and the associating for more than one emitter from the plurality of emitters.

58. The method of claim 54, wherein the associating of the receiver to the emitter is performed after the first die is coupled to the second die.

59. A machine-readable storage medium comprising instructions for calibrating at least one optical interconnect between a first die and a second die, which when executed by a processor causes the processor to:

transmit an optical signal from an emitter on the first die, wherein the emitter is configured to transmit the optical signal through a first active region of the first die and/or a second active region of the second die, the first active region comprising one or more first transistors, and the second active region comprising one or more second transistors; and associate a receiver from a plurality of receivers on the second die to the emitter on the first die based on which receiver from the plurality of receivers receives the transmitted optical signal from the emitter, wherein placement of the receiver and placement of the emitter are not aligned.

60. The machine-readable storage medium of claim 59, wherein the associating of the receiver on the second die to the emitter on the first die establishes an optical interconnect between the first die and the second die.

61. The machine-readable storage medium of claim 59, wherein the first die comprises a plurality of emitters.

62. The machine-readable storage medium of claim 61, further comprising instructions, which when executed by a processor causes the processor to iteratively perform the transmitting and the associating for more than one emitter from the plurality of emitters.

63. The machine-readable storage medium of claim 59, wherein the associating of the receiver to the emitter is performed after the first die is coupled to the second die.

64. The device of claim 1, wherein the active region of the first die is distinct from the optical emitter and the optical receiver.

65. The device of claim 16, wherein the active region of the first die is distinct from the optical emitter and the optical receiver.

* * * * *